United States Patent
Tan et al.

(10) Patent No.: US 8,536,558 B1
(45) Date of Patent: Sep. 17, 2013

(54) RRAM STRUCTURE WITH IMPROVED MEMORY MARGIN

(75) Inventors: Shyue Seng (Jason) Tan, Singapore (SG); Eng Huat Toh, Singapore (SG); Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/562,646

(22) Filed: Jul. 31, 2012

(51) Int. Cl.
  *H01L 47/00* (2006.01)
(52) U.S. Cl.
  USPC .... 257/4; 257/3; 257/E45.001; 257/E47.001; 257/E21.004; 438/382; 438/104; 438/381; 438/14; 438/99
(58) Field of Classification Search
  USPC .............. 257/2, 3, 4, E45.001, E47.001, 295, 257/314, 506; 438/382, 104, 381, 14; 365/148, 365/163
  See application file for complete search history.

(56) References Cited

U.S. PATENT DOCUMENTS

| | | | |
|---|---|---|---|
| 8,241,947 B2 * | 8/2012 | Liu et al. ........................ | 438/102 |
| 8,279,657 B2 * | 10/2012 | Takagi et al. .................. | 365/148 |
| 2008/0247219 A1 * | 10/2008 | Choi et al. ..................... | 365/148 |
| 2010/0038791 A1 * | 2/2010 | Lee et al. ....................... | 257/758 |
| 2010/0039846 A1 * | 2/2010 | Lai et al. ........................ | 365/51 |
| 2010/0258852 A1 * | 10/2010 | Lim et al. ...................... | 257/324 |
| 2011/0227019 A1 * | 9/2011 | Kuniya et al. ................. | 257/2 |
| 2011/0227026 A1 * | 9/2011 | Sekar et al. .................... | 257/4 |
| 2011/0233511 A1 * | 9/2011 | Kawashima et al. ........... | 257/4 |
| 2012/0077309 A1 * | 3/2012 | Chen ............................. | 438/102 |
| 2012/0261635 A1 * | 10/2012 | Zhou et al. .................... | 257/2 |
| 2013/0044532 A1 * | 2/2013 | Bethune et al. ............... | 365/148 |
| 2013/0075682 A1 * | 3/2013 | Lee ................................ | 257/2 |

OTHER PUBLICATIONS

I. G. Baek et al., "Highly Scalable Non-Volatile Resistive Memory Using Simple Binary Oxide Driven by Asymmetric Unipolar Voltage Pulses," Samsung Electronics Co., Ltd. et al., South Korea, 0-7803-8684-1/04, pp. 1-4, IEEE (2004).
I. G. Baek et al., "Multi-Layer Cross-Point Binary Oxide Resistive Memory (OxRRAM) for Post-NAND Storage Application," Samsung Electronics Co., Ltd. et al., South Korea, 0-7803-9269-08/05, pp. 1-4, IEEE (2005).
M. J. Kim et al., "Low Power Operating Bipolar TMO ReRAM for Sub 10nm Era," Samsung Electronics Co., Ltd. et al., South Korea, IEDM10-444, 978-1-4244-7419-6/10, pp. 444-447, IEEE (2010).

(Continued)

*Primary Examiner* — Ha Tran T Nguyen
*Assistant Examiner* — Thai T Vuong
(74) *Attorney, Agent, or Firm* — Ditthavong Mori & Steiner, P.C.

(57) ABSTRACT

Resistive random-access memory (RRAM) structures are formed with ultra-thin RRAM-functional layers, thereby improving memory margins. Embodiments include forming an interlayer dielectric (ILD) over a bottom electrode, forming a sacrificial layer over the ILD, removing a portion of the ILD and a portion of the sacrificial layer vertically contiguous with the portion of the ILD, forming a cell area, forming a metal layer within the cell area, forming an interlayer dielectric structure above or surrounded by and protruding above the metal layer, a top surface of the interlayer dielectric structure being coplanar with a top surface of the sacrificial layer, removing the sacrificial layer, forming a memory layer on the ILD and/or on side surfaces of the interlayer dielectric structure, and forming a dielectric layer surrounding at least a portion of the interlayer dielectric structure.

10 Claims, 40 Drawing Sheets

(56) References Cited

OTHER PUBLICATIONS

H. Y. Lee et al., "Evidence and Solution of Over-Reset Problem for HfOx Based Resistive Memory with Sub-Ns Switching Speed and High Endurance," Institute of Electronics Engineering, National Tsing Hua University et al., Taiwan R.O.C., IEDM10-460, 978-1-4244-7419-6/10, pp. 460-463, IEEE (2010).

Y. Wang et al., "Logic-Based Mega-Bit CuxSiyO emRRAM with Excellent Scalability Down to 22nm Node for Post-emFLASH SOC Era," ASIC and System State Key Laboratory, Dept. Microelectronics, Fudan University et al., 978-1-4577-0224-2/11, pp. 97-98, IEEE (2011).

Z. Wei et al., "Highly Reliable TaOx ReRAM and Direct Evidence of Redox Reaction Mechanism," Advanced Devices Development Center, Panasonic Corporation et al., 1-4244-2377-4/08, pp. 293-296, IEEE (2008).

* cited by examiner

RRAM STRUCTURE WITH IMPROVED MEMORY MARGIN

TECHNICAL FIELD

The present disclosure relates to resistive random-access memory structures (RRAMs) for non-volatile memory (NVM) devices. The present disclosure is particularly applicable to an RRAM structure with an improved memory margin.

BACKGROUND

RRAM structures have received increased attention because of their ability to combine fast operation at high densities for non-volatile data compared to other NVM devices. However, RRAM structures still suffer from several challenges, such as poor resistance uniformity, distribution of resistance states that may lead to smaller memory margins, and poor-performance back-end-of-the-line (BEOL) cell selectors.

A need therefore exists for methodology enabling RRAM structures with improved memory margins while maintaining simplicity and scalability, and the resulting structures.

SUMMARY

An aspect of the present disclosure is an efficient method for fabricating an RRAM structure with an ultra-thin RRAM material (angstrom regime) to improve the memory margin.

Another aspect of the present disclosure is an RRAM structure with an ultra-thin RRAM-functional material layer (angstrom regime) to improve the memory margin.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming an interlayer dielectric (ILD) over a bottom electrode, forming a sacrificial layer over the ILD, removing a portion of the ILD and a portion of the sacrificial layer vertically contiguous with the portion of the ILD, forming a cell area, forming a metal layer within the cell area, forming an interlayer dielectric structure above or surrounded by and protruding above the metal layer, with a top surface of the interlayer dielectric structure being coplanar with a top surface of the sacrificial layer, removing the sacrificial layer, forming a memory layer on the ILD and/or on side surfaces of the interlayer dielectric structure, and forming a dielectric layer surrounding at least a portion of the interlayer dielectric structure.

Aspects of the present disclosure include forming the memory layer prior to forming the sacrificial layer, forming the dielectric layer on the memory layer after removing the sacrificial layer, and removing a portion of the memory layer from the ILD not under the dielectric layer. Other aspects include forming the memory layer on side surfaces of the portion of the interlayer dielectric structure above the metal layer, and forming the dielectric layer surrounding the memory layer. Further aspects include forming the memory layer on side surfaces of the portion of the interlayer dielectric structure and on the ILD, and forming the dielectric layer above the memory layer on the ILD and surrounding the memory layer on the side surfaces of the portion of the interlayer dielectric structure. Another aspect includes forming the metal layer as rectangular-shaped within the cell area below the interlayer dielectric structure. A further aspect includes forming a top surface of the metal layer above a top surface of the ILD. An additional aspect includes forming the metal layer as u-shaped within the cell area and between the memory layer and interlayer dielectric structure with a top surface of the u-shaped metal layer being coplanar with a top surface of the memory layer. Other aspects include forming the memory layer on the ILD, and forming a top surface of the metal layer coplanar with a top surface of the memory layer. Another aspect includes forming a top electrode over the ILD, the dielectric layer, and the interlayer dielectric structure.

Another aspect of the present disclosure is a device including: a bottom electrode, a metal layer, an ILD on the bottom electrode surrounding the metal layer, an interlayer dielectric structure above or surrounded by and protruding above the metal layer, a memory layer on the ILD and/or on side surfaces of the interlayer dielectric structure above the metal layer, a dielectric layer above the ILD and surrounding at least a portion of the interlayer dielectric structure above the metal layer, and a top electrode covering the ILD, the interlayer dielectric structure, and the dielectric layer.

Aspects include a device including the memory layer being on the ILD under the dielectric layer and surrounding a top portion of the metal layer. Further aspects include the metal layer being u-shaped, and a bottom portion of the interlayer dielectric structure being surrounded by the u-shaped metal layer, and a top portion of the interlayer dielectric structure being surrounded by the dielectric layer. Other aspects include the metal layer being u-shaped, and a bottom portion of the interlayer dielectric structure being surrounded by the u-shaped metal layer, and a top portion of the interlayer dielectric structure being surrounded by the memory layer. Additional aspects include the dielectric layer surrounding the memory layer, and the memory layer being contiguous and aligned with vertical portions of the u-shaped metal layer. Other aspects include a first portion of the memory layer surrounding the top portion of the interlayer dielectric structure, and a second portion of the memory layer being on the ILD under the dielectric layer. Further aspects include the metal layer being rectangular-shaped, and the interlayer dielectric structure being entirely above the metal layer. Another aspect includes the memory layer being on the ILD under the dielectric layer and surrounding a top portion of the metal layer. A further aspect includes the memory layer being on side surfaces of the interlayer dielectric structure and side surfaces of a top portion of the metal layer. Additional aspects include a first portion of the memory layer being on the ILD under the dielectric layer, and a second portion of the memory layer being on side surfaces of the interlayer dielectric structure and side surfaces of a top portion of the metal layer.

Another aspect of the present disclosure includes: forming an ILD over a bottom electrode, forming a sacrificial layer on the ILD, removing a portion of the ILD and the sacrificial layer, forming a cavity, forming a metal layer within the cavity, filling the cavity with an interlayer dielectric material, removing the sacrificial layer exposing at least a portion of the interlayer dielectric material, forming a memory layer on side surfaces of the interlayer dielectric material and/or on the ILD surrounding the interlayer dielectric material, forming a dielectric layer surrounding the interlayer dielectric material and/or the memory layer, and forming a top electrode over the ILD, the dielectric layer, and the interlayer dielectric material.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of poor resistance uniformity leading to poor memory margins attendant upon employing RRAM structures for NVM devices. In accordance with embodiments of the present disclosure, an RRAM structure is produced with an ultra-thin RRAM-functional material layer (angstrom regime) to improve the memory margin.

Methodology in accordance with embodiments of the present disclosure includes forming an ILD over a bottom electrode, forming a sacrificial layer over the ILD, removing a portion of the ILD and a portion of the sacrificial layer vertically contiguous with the portion of the ILD, forming a cell area, followed by forming a metal layer within the cell area, and forming an interlayer dielectric structure above or surrounded by and protruding above the metal layer. The top surface of the interlayer dielectric structure may be coplanar with a top surface of the sacrificial layer. The sacrificial layer may then be removed. A memory layer may be formed on the ILD and/or on side surfaces of the interlayer dielectric structure followed by forming a dielectric layer surrounding at least a portion of the interlayer dielectric structure. Next, a top electrode may be formed over the ILD, the dielectric layer, and the interlayer dielectric structure.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
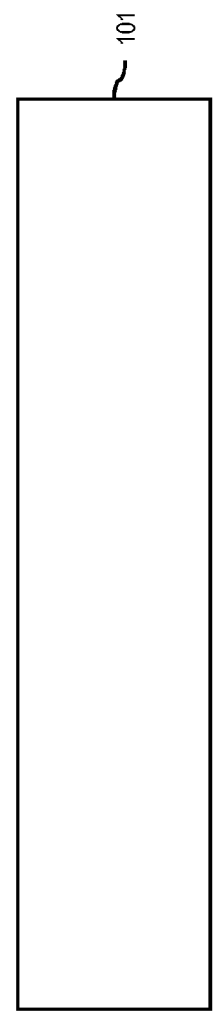
FIGS. 1 through 11 schematically illustrate a method for forming an RRAM structure with improved memory margin, in accordance with an exemplary embodiment.

Adverting to FIG. 1, a method of forming an RRAM structure with an improved memory margin, in accordance with an exemplary embodiment, begins with a bottom electrode 101. The bottom electrode 101 may be formed of tungsten (W), aluminum (Al), platinum (Pt), titanium nitride and titanium (TiN/Ti), TiN, ruthenium (Ru), nickel (Ni), or polysilicon to a thickness of 100 to 1000 angstroms (Å).

Figure 2:
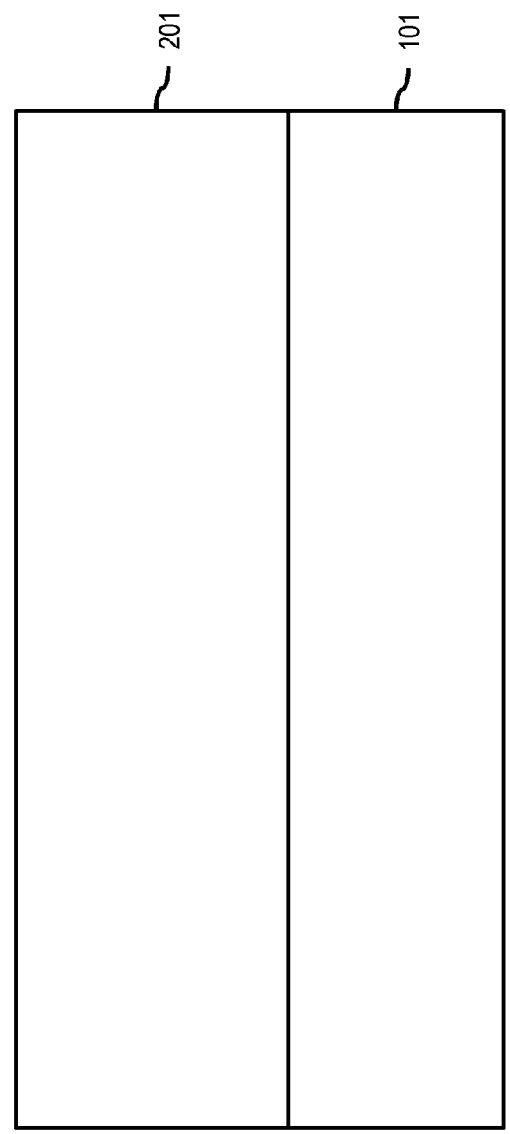

Next, an ILD 201 may be formed over the bottom electrode 101, as illustrated in FIG. 2. The ILD 201 may be formed of a low thermal conductivity dielectric, such as silicon oxide ($SiO_2$), silicon oxynitride (SiON), silicon nitride ($Si_3N_4$), or fluorine-doped $SiO_2$.

Figure 3:
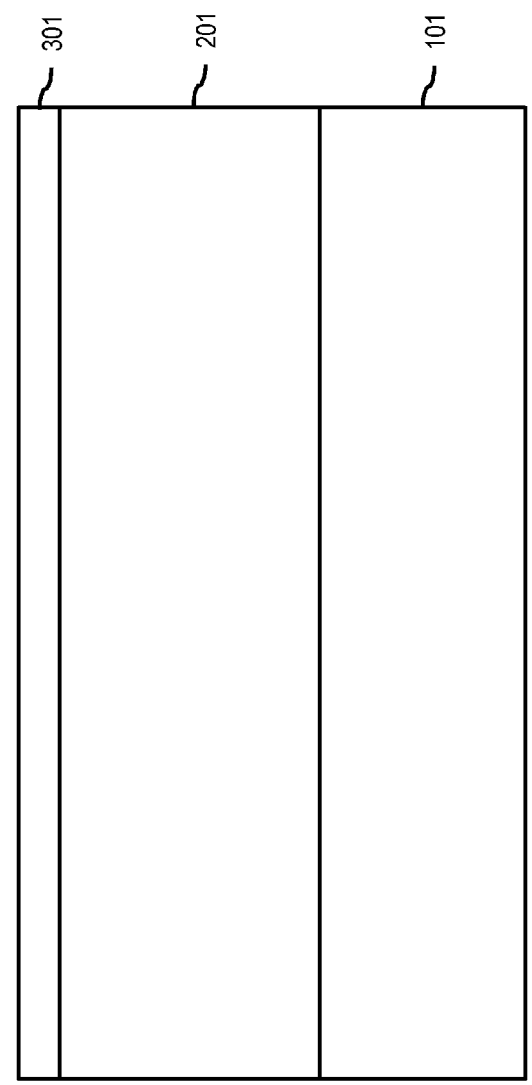

Further, as illustrated in FIG. 3, a memory layer 301 may be formed over the ILD 201. The memory layer 301 may be formed of any type of RRAM-functional material, such as titanium oxide (TiOx), nickel oxide (NiOx), hafnium oxide (HfOx), tungsten oxide (WOx), tantalum oxide (TaOx), vanadium oxide (VOx), copper oxide (CuOx), or the like. The memory layer 301 may be formed to a thickness of 10 to 100 Å.

Figure 4:
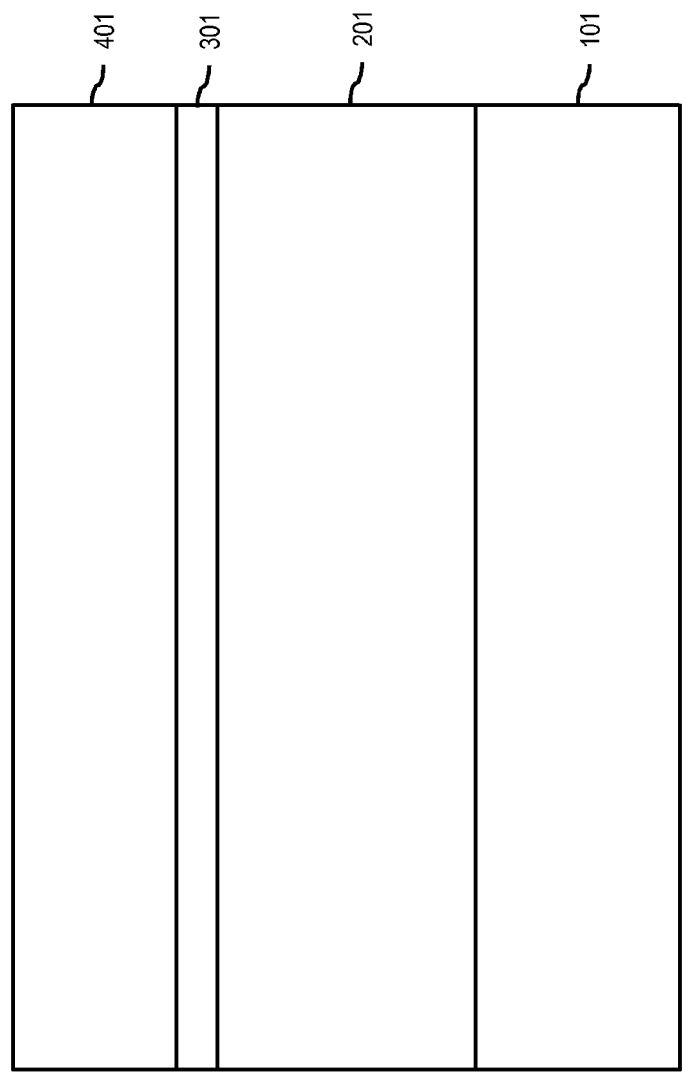

Subsequently, a sacrificial layer 401 may be formed over the memory layer 301 (FIG. 4). The sacrificial layer 401 may be formed of any sacrificial material, such as polysilicon, that can be removed later in the processing of the RRAM structure provided that it has a different etch selectivity than the memory layer 301.

Figure 5:
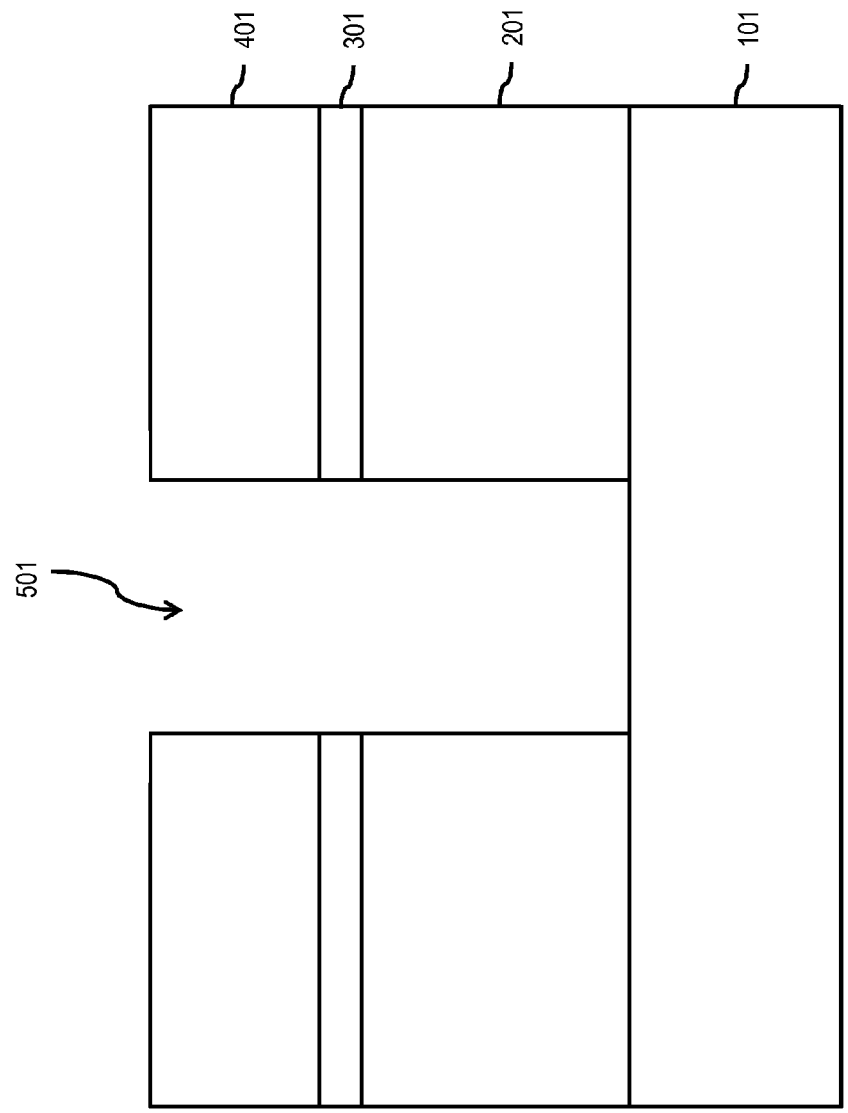

Next, a cell area 501 may be formed by removing portions of the sacrificial layer 401, the memory layer 301, and the ILD 201, as illustrated in FIG. 5. The cell area 501 may be formed according to any process, such as a dry contact-etch process, that is able to remove the portions of the three layers. The cell area 501 may be formed to a width of 30 to 60 nanometers (nm) and may be formed down to the bottom electrode 101.

Figure 6:
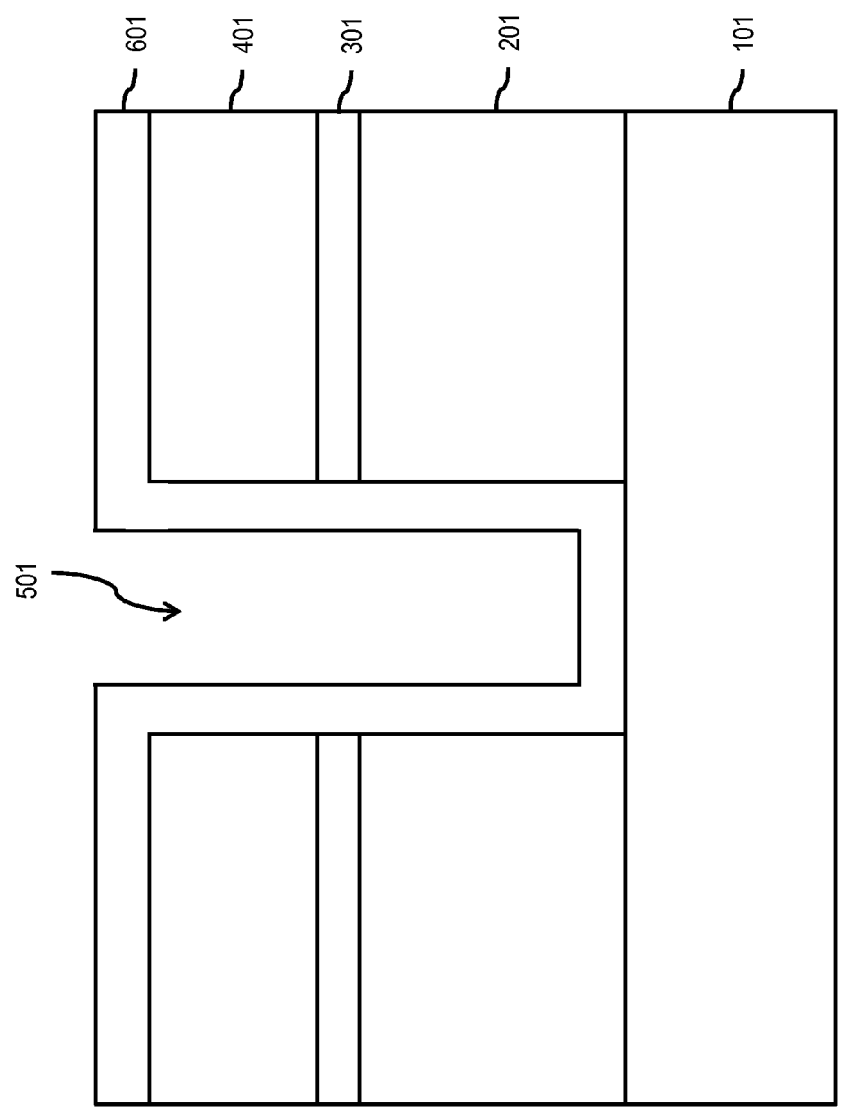

Adverting to FIG. 6, a metal layer 601 may be conformally deposited over the sacrificial layer 401 and within the cell area 501. The metal layer 601 may be formed of W, Ti, TiN, or Al to a thickness of 10 to 100 Å.

Figure 7:
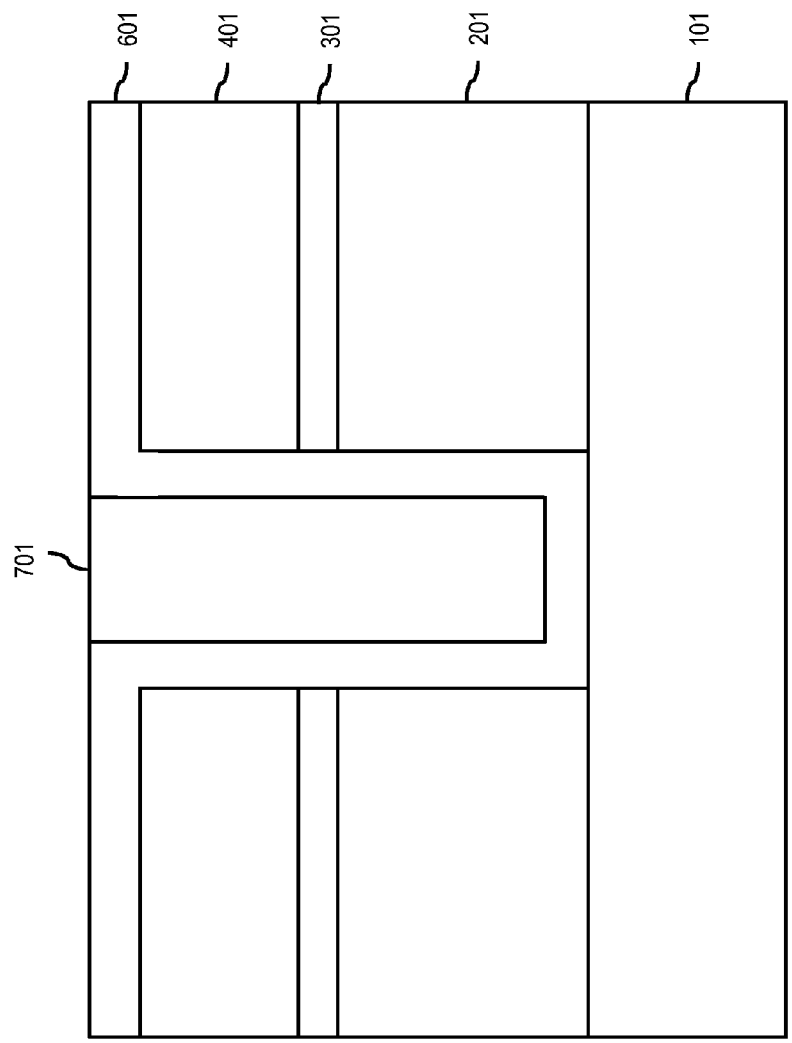

The remaining cell area 501 may be subsequently filled with an interlayer dielectric material to form an interlayer dielectric structure 701 (FIG. 7). The interlayer dielectric material used to form the interlayer dielectric structure 701 may be any interlayer dielectric material, such as $SiO_2$, SiON, $Si_3N_4$, or fluorine-doped $SiO_2$, provided that the interlayer dielectric material employed differs from the sacrificial layer 401. However, the interlayer dielectric material of the interlayer dielectric structure 701 may be the same as (or different than) the interlayer dielectric material of the ILD 201. The interlayer dielectric structure 701 may be formed to a width of the cell area 501 less the thickness of the metal layer 601 (e.g., 20 to 59 nm).

Figure 8:
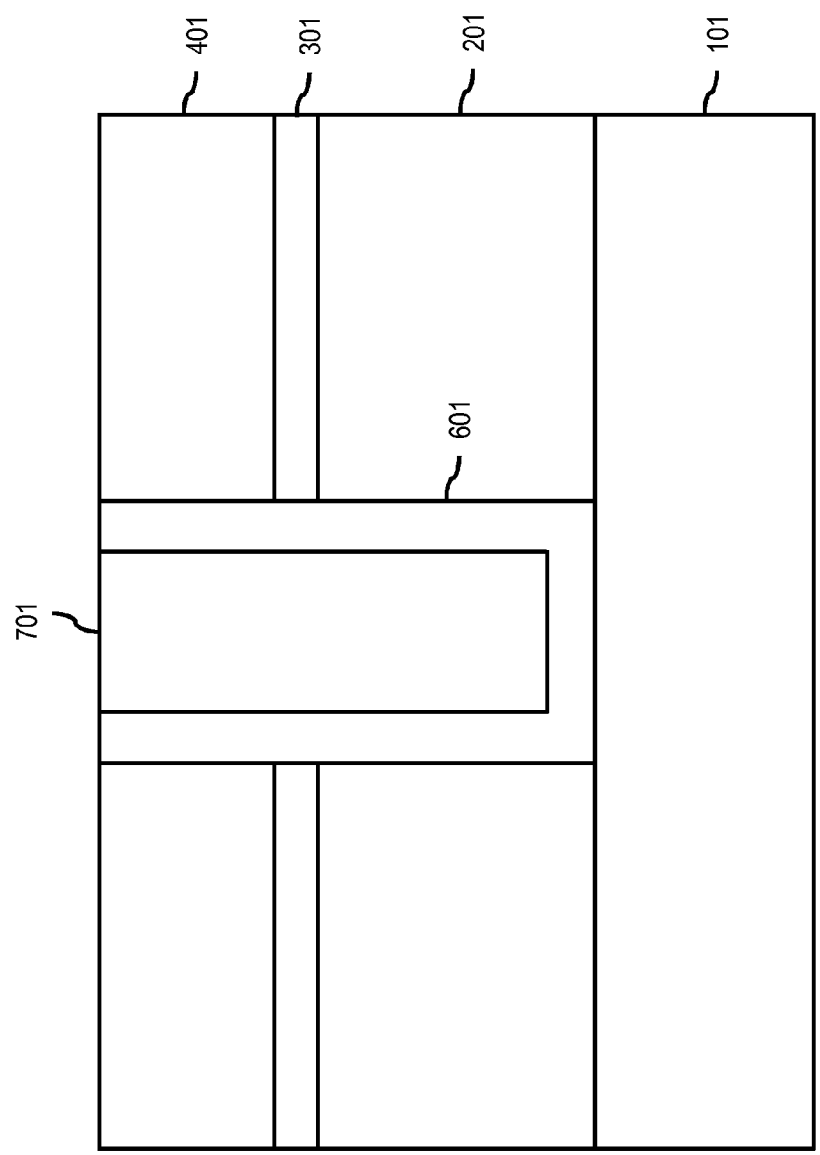

Subsequently, the metal layer 601 and the interlayer dielectric structure 701 above the top surface of the sacrificial layer 401 are removed, as illustrated in FIG. 8. The metal layer 601 and the interlayer dielectric structure 701 above the top surface of the sacrificial layer 401 may be removed according to any known process, such as chemical mechanical polishing (CMP) down to the sacrificial layer 401.

Figure 9:
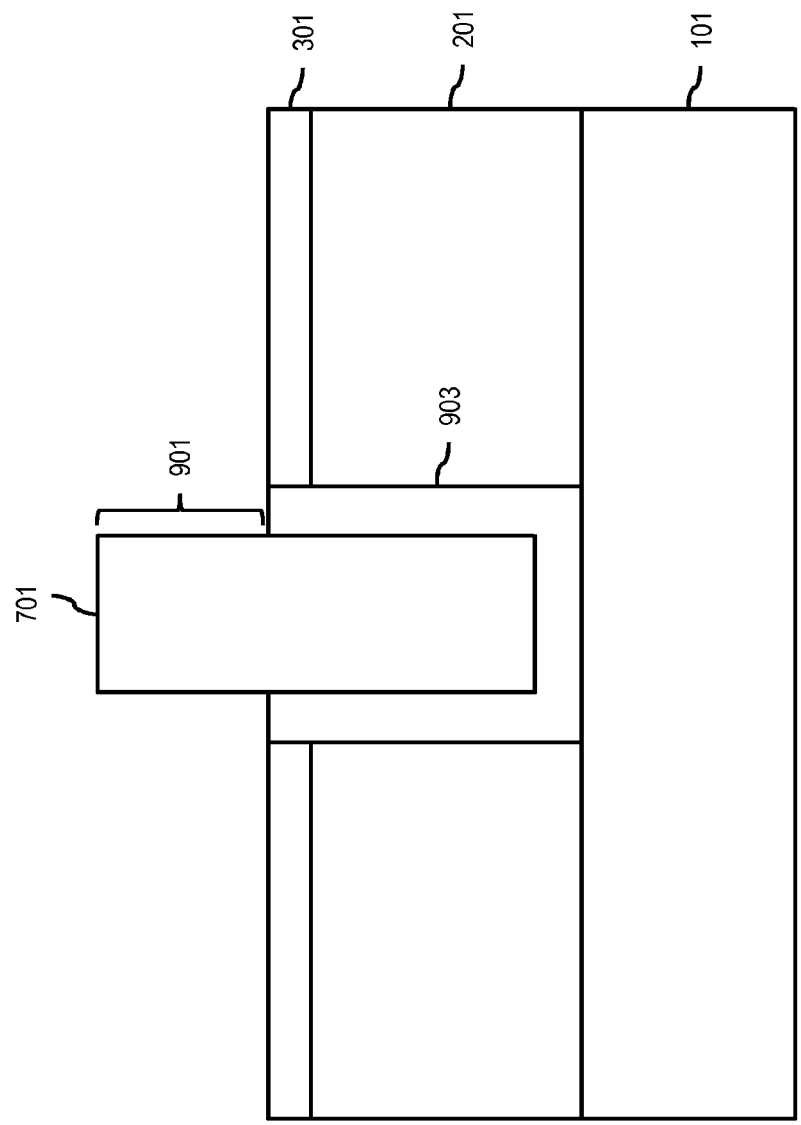

After the sacrificial layer 401 is exposed, it may be removed according to any process that is selective to the interlayer dielectric structure 701, such as a blanket etch process. Additionally, a portion of the metal layer 601 that is above the top surface of the memory layer 301 is removed, exposing a protruding portion 901 of the interlayer dielectric structure 701, as illustrated in FIG. 9. The portion of the metal layer 601 may be removed according to any process, such as by the one used to remove the sacrificial layer 401 or another etch process. Alternatively, the portion of the metal layer 601 that is above the top surface of the memory layer 301 may not be removed (not shown for illustrative convenience). The remaining portion of the metal layer 601 is a u-shaped metal layer 903. As illustrated in FIG. 9, the top surfaces of the vertical portions of the u-shaped metal layer 903 may be coplanar with the top surface of the memory layer 301.

Figure 10:
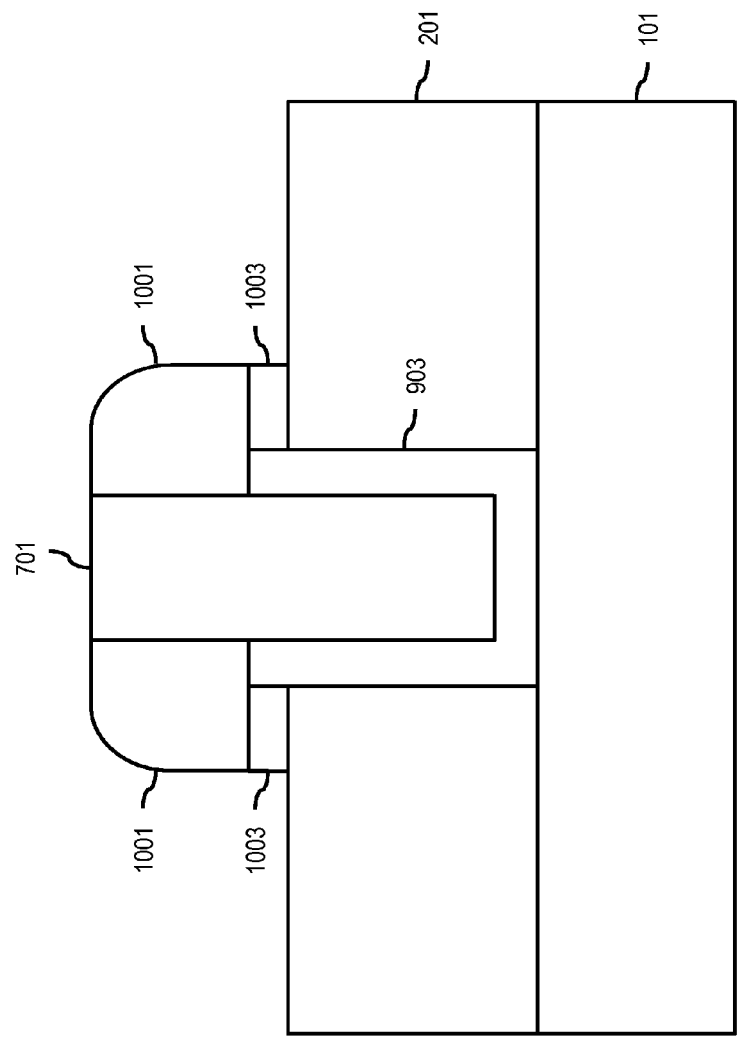

Adverting to FIG. 10, a dielectric layer 1001 may be formed as spacers surrounding the protruding portion 901 of the interlayer dielectric structure 701. The dielectric layer 1001 may be formed of a dielectric material, such as $SiO_2$, SiON, or $Si_3N_4$ to a horizontal width of 5 to 30 nm. Further, the portion of the memory layer 301 that is not covered by the dielectric layer 1001 is removed leaving a covered memory layer 1003 between the dielectric layer 1001 and the ILD 201 in a vertical direction, and adjacent to the exposed portion of the u-shaped metal layer 903 in a horizontal direction.

Figure 11:
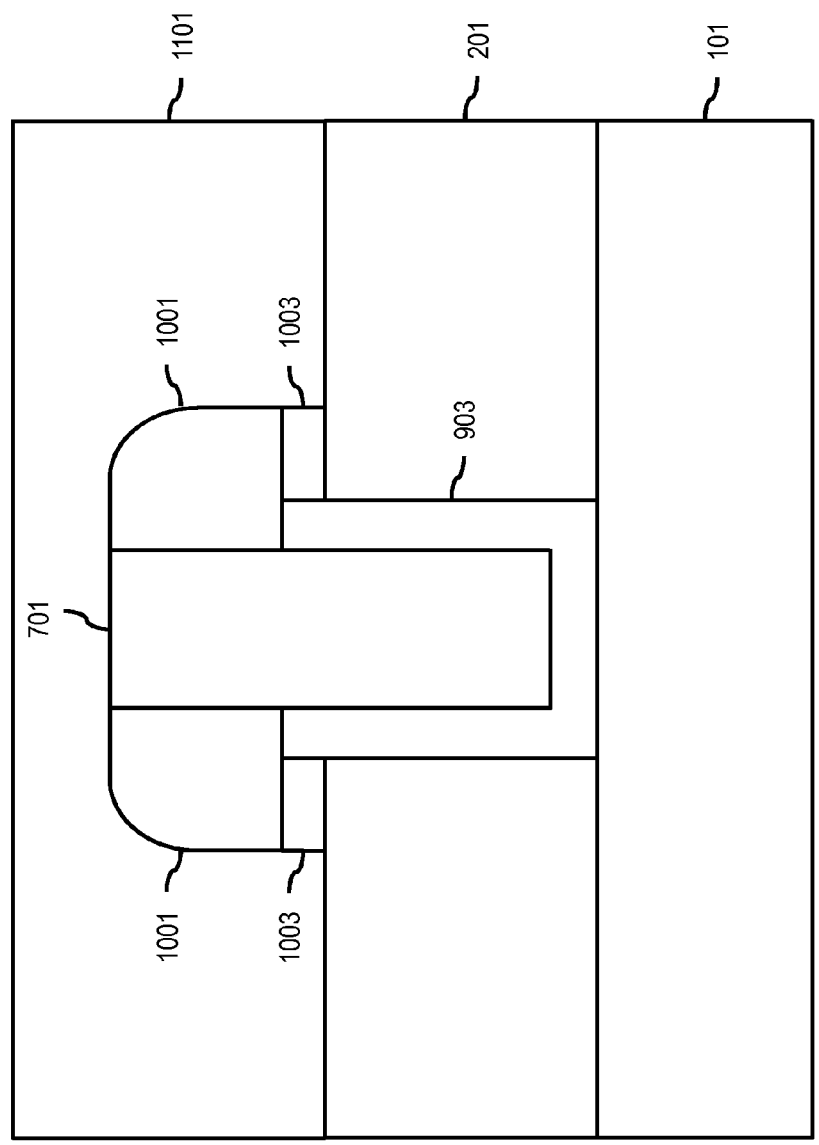

Subsequently, a top electrode 1101 may be formed over the entire structure, including the ILD 201, the dielectric layer 1001, and the interlayer dielectric structure 701, as illustrated in FIG. 11. The top electrode 1101 may be formed of Al, Pt, TiN/Ti, TiN, Ru, Ni, or polysilicon to a thickness of 100 to 1000 Å. The resulting structure is an RRAM structure with an improved memory margin.

Figure 12:
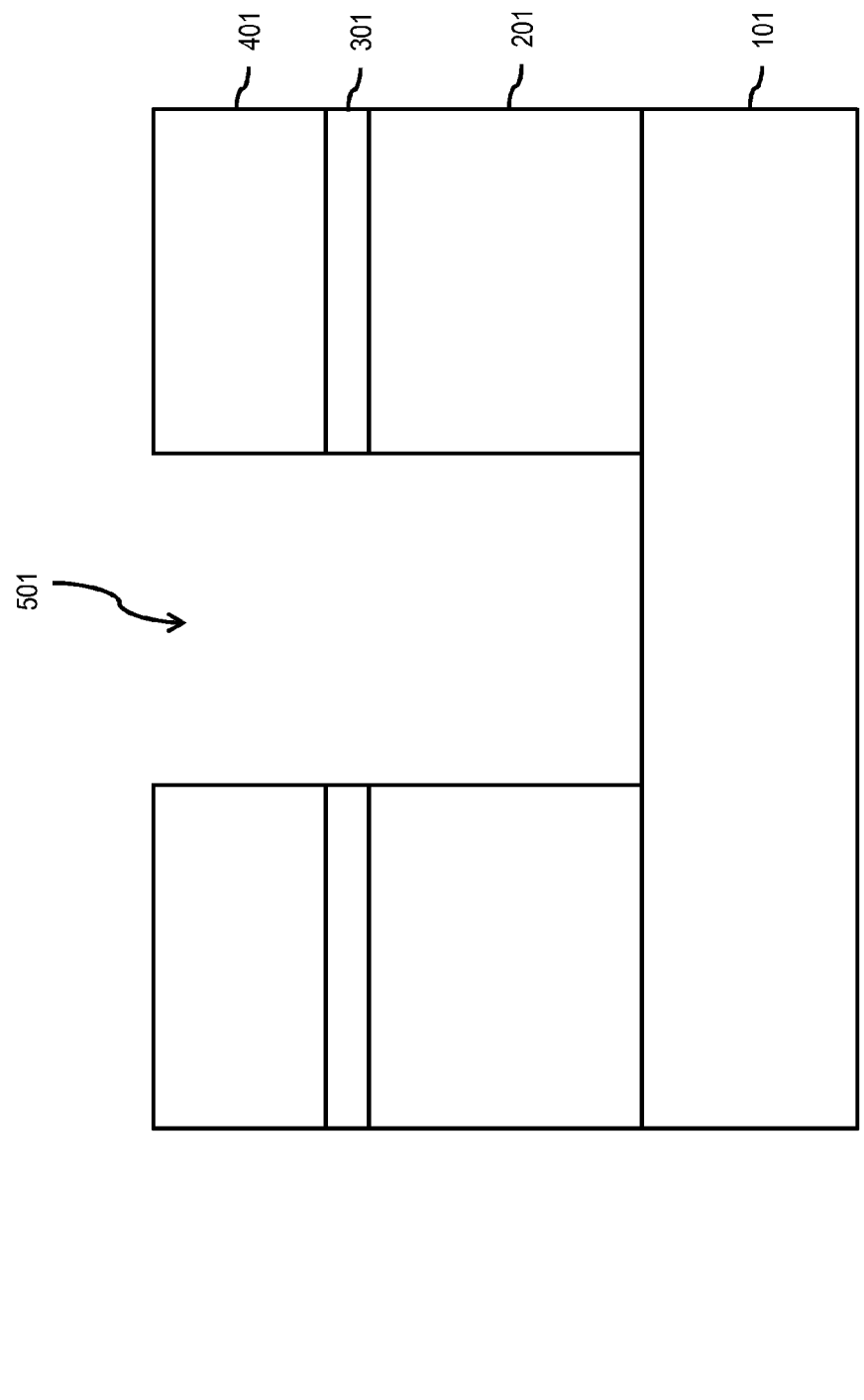
FIGS. 12 through 40 schematically illustrate alternative methods for forming other RRAM structures with improved memory margins, in accordance with other exemplary embodiments.

Adverting to FIG. 12, a method of forming an RRAM structure with an improved memory margin, in accordance with another exemplary embodiment, begins with the bottom electrode 101, the ILD 201, the memory layer 301, and the sacrificial layer 401, with a cell area 501 formed within the three layers. Thus, the method begins similarly to the method discussed above in FIG. 1 through FIG. 5.

Figure 13:
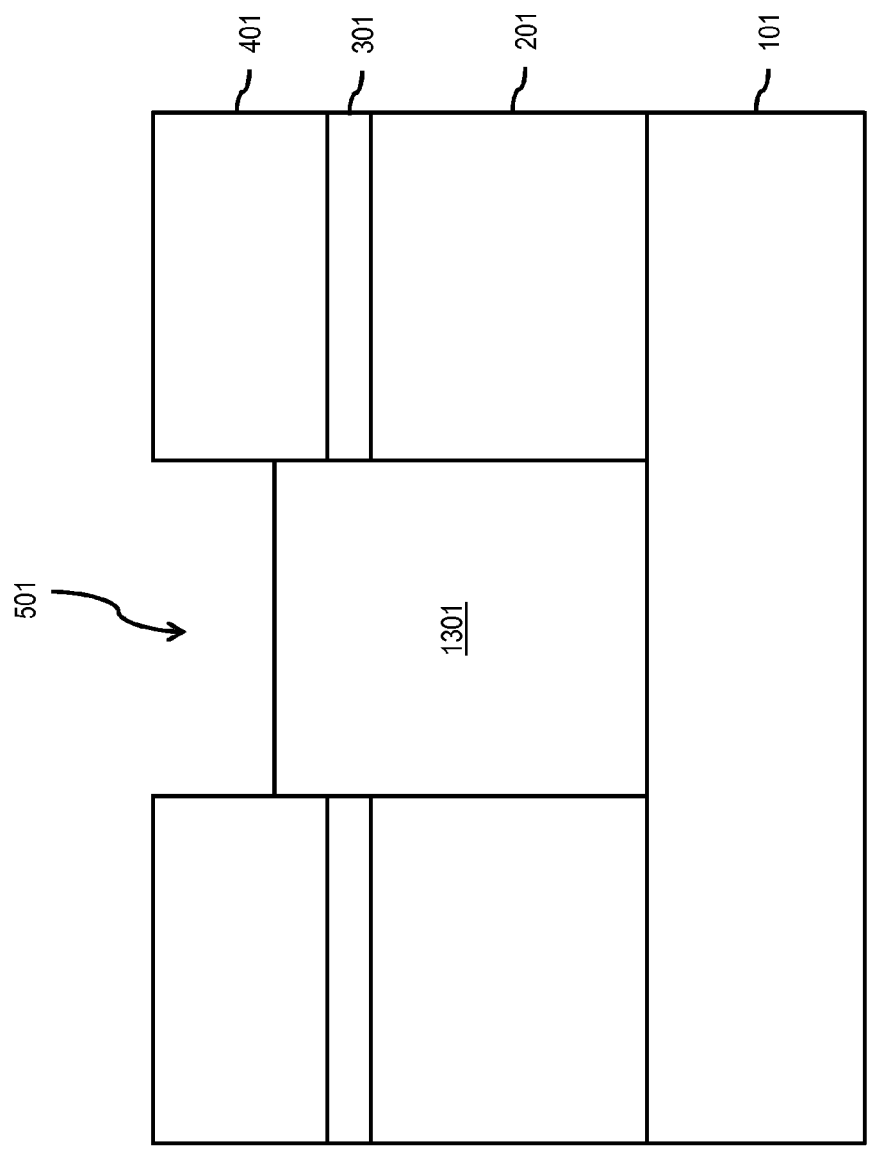

Adverting to FIG. 13, a metal layer 1301 may be formed within the cell area 501. The metal layer 1301 may be formed of W, Ti, Al or TiN to a width of 30 to 60 nm (e.g., the width of the cell area 501) and a height of 50 to 500 nm. Thus, as illustrated, the metal layer 1301 may be formed in the shape of a rectangle.

Figure 14:
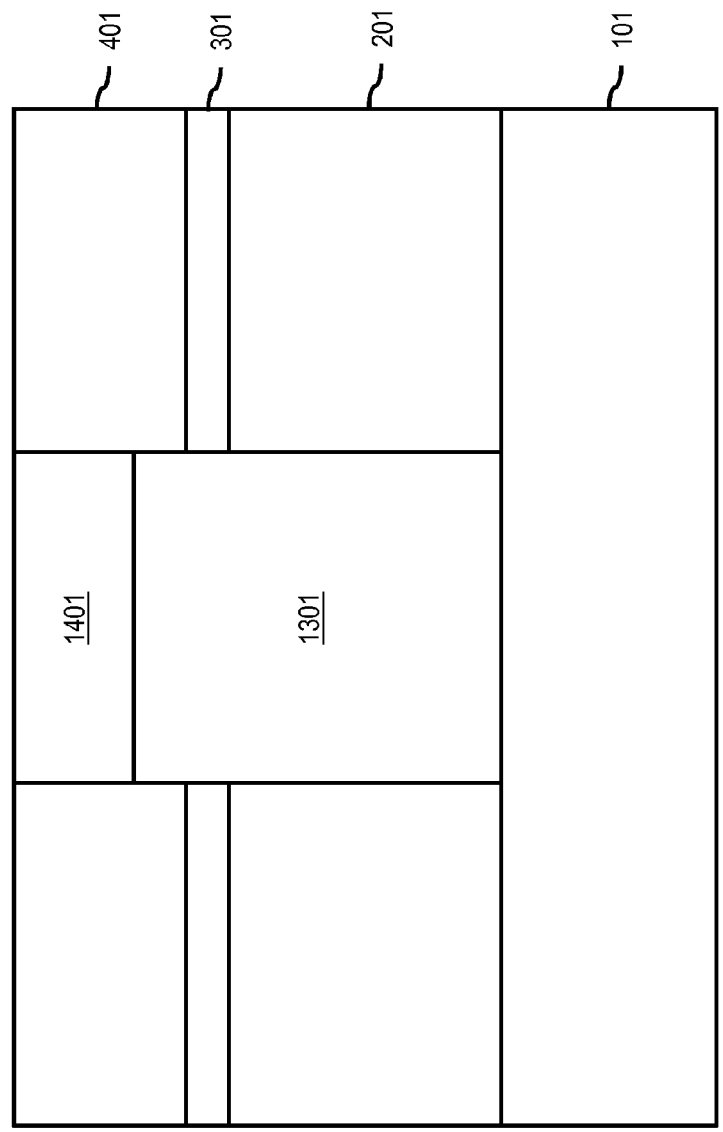

The remaining cell area 501 may be subsequently filled with an interlayer dielectric material to form an interlayer dielectric structure 1401 (FIG. 14). The interlayer dielectric material used to form the interlayer dielectric structure 1401 may be any interlayer dielectric material, such as $SiO_2$, SiON, $Si_3N_4$, or fluorine-doped $SiO_2$, provided that the interlayer dielectric material employed differs from the material of the sacrificial layer 401. However, the interlayer dielectric material of the interlayer dielectric structure 1401 may be the same as (or different than) the interlayer dielectric material of the ILD 201.

Figure 15:
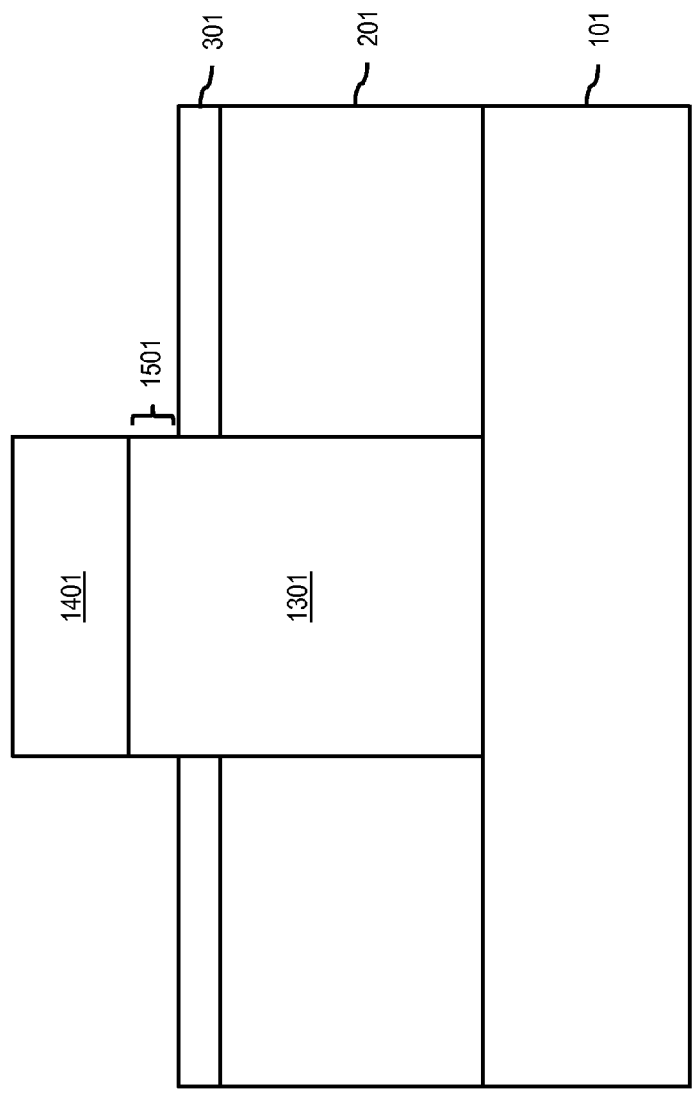

Subsequently, the sacrificial layer 401 may be removed, as illustrated in FIG. 15, according to any process that is selective to the interlayer dielectric structure 1401, such as a blanket etch process. Removal of the sacrificial layer 401 exposes the interlayer dielectric structure 1401 and a portion 1501 of the metal layer 1301.

Figure 16:
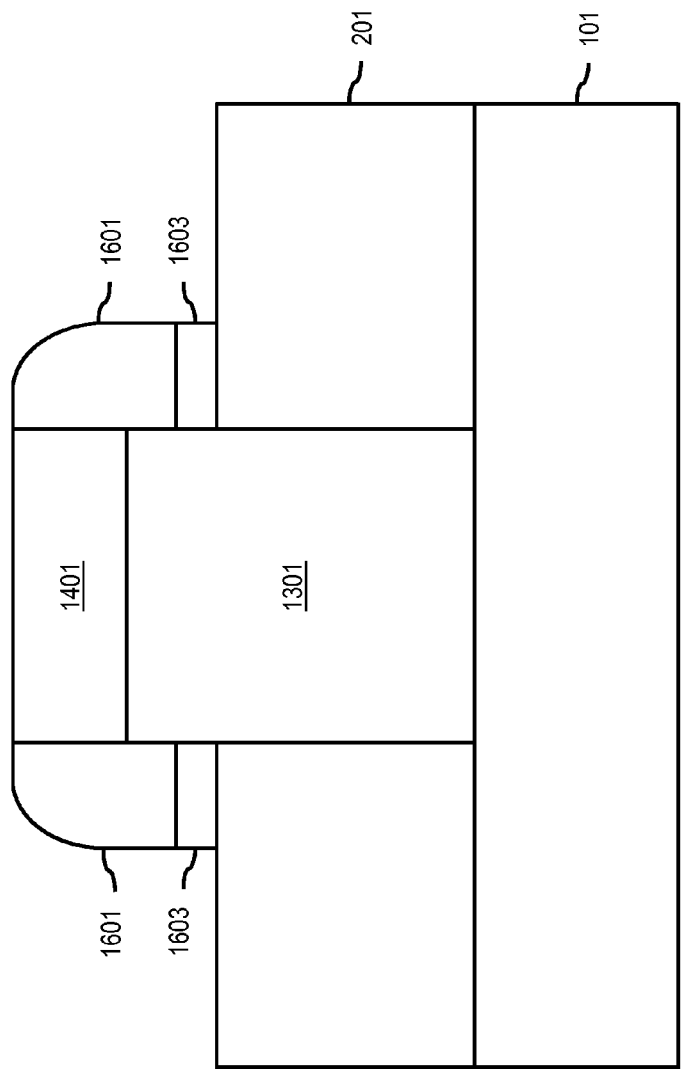

Adverting to FIG. 16, a dielectric layer 1601 may be formed as spacers surrounding the interlayer dielectric structure 1401 and the portion 1501 of the metal layer 1301. The dielectric layer 1601 may be formed of a dielectric material, such as $SiO_2$, SiON, or $Si_3N_4$, to a horizontal width of 5 to 30 nm. Further, the portion of the memory layer 301 that is not covered by the dielectric layer 1601 may be removed leaving a covered memory layer 1603 between the dielectric layer 1601 and the ILD 201 in a vertical direction, and adjacent to an exposed portion of the metal layer 1301 in a horizontal direction.

Figure 17:
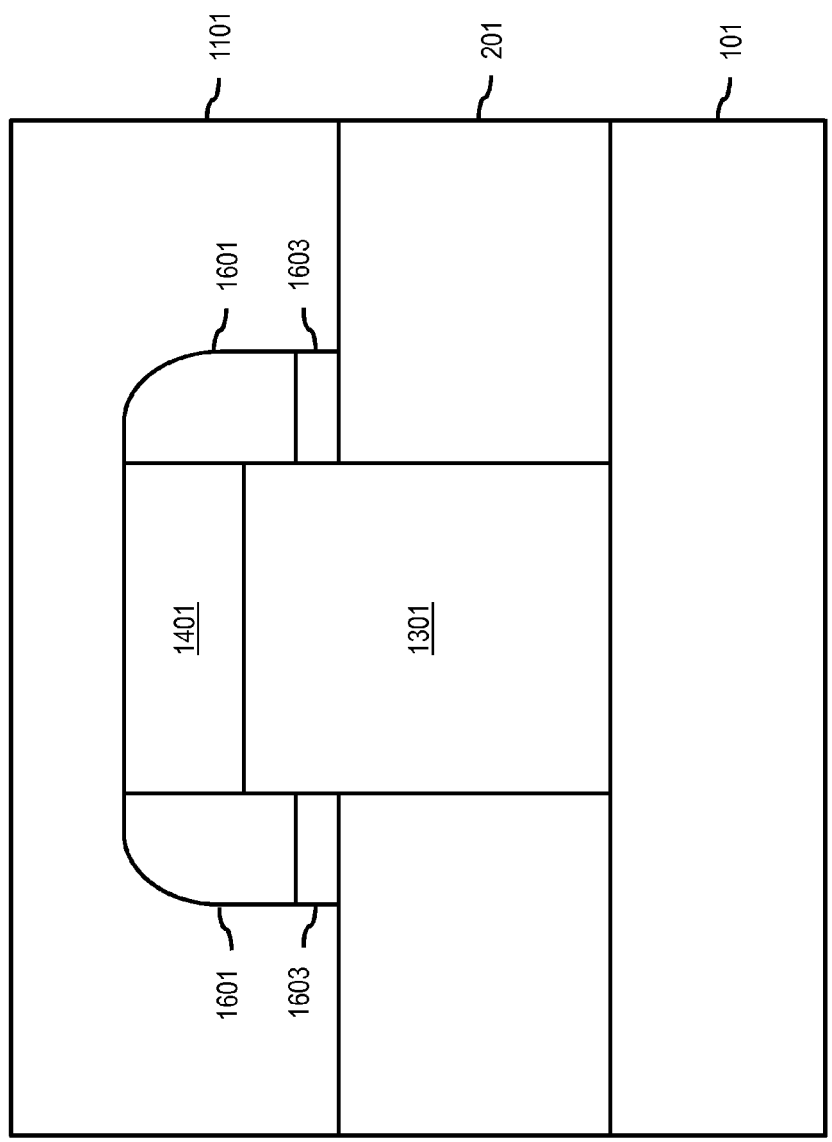

Subsequently, a top electrode 1101 like that of FIG. 11 may be formed over the entire structure, including the ILD 201, the dielectric layer 1601, and the interlayer dielectric structure 1401, as illustrated in FIG. 17. The top electrode 1101 may be formed of Al, Pt, TiN/Ti, TiN, Ru, Ni, or polysilicon to a thickness of 100 to 1000 Å.

Figure 18:
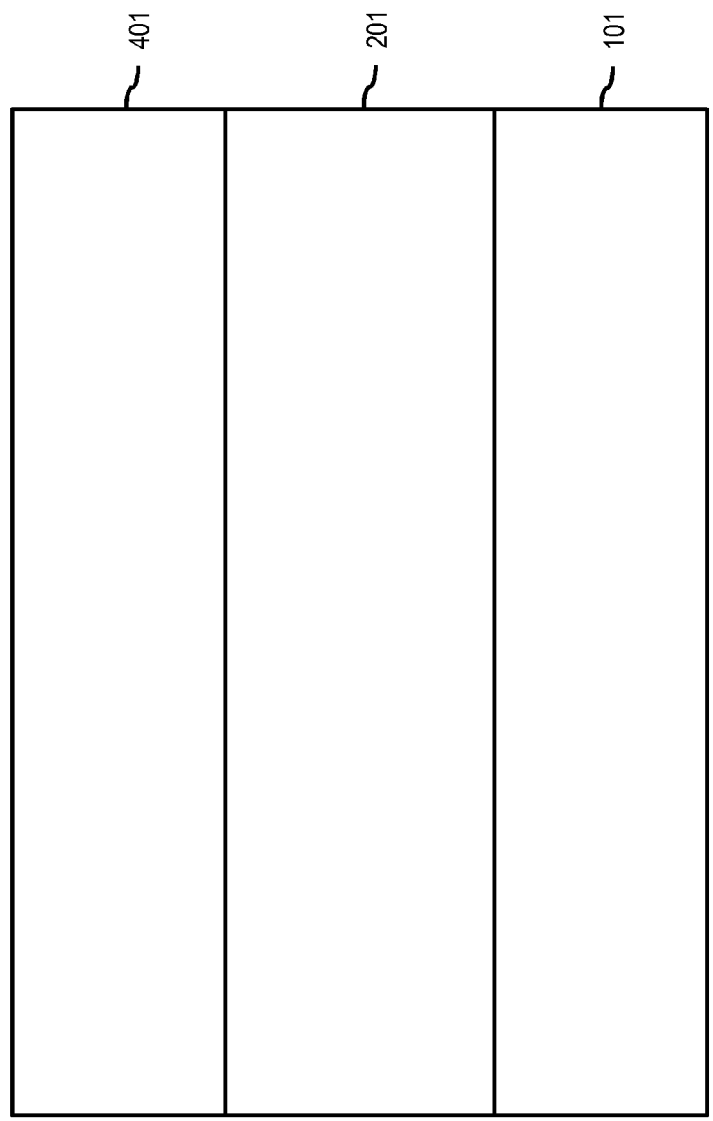

Adverting to FIG. 18, a method of forming an RRAM structure with an improved memory margin, in accordance with another exemplary embodiment, begins with the bottom electrode 101, the ILD 201, and the sacrificial layer 401. Thus, the method begins similarly to the methods discussed above, except for the exclusion of the memory layer 301 between the ILD 201 and the sacrificial layer 401.

Figure 19:
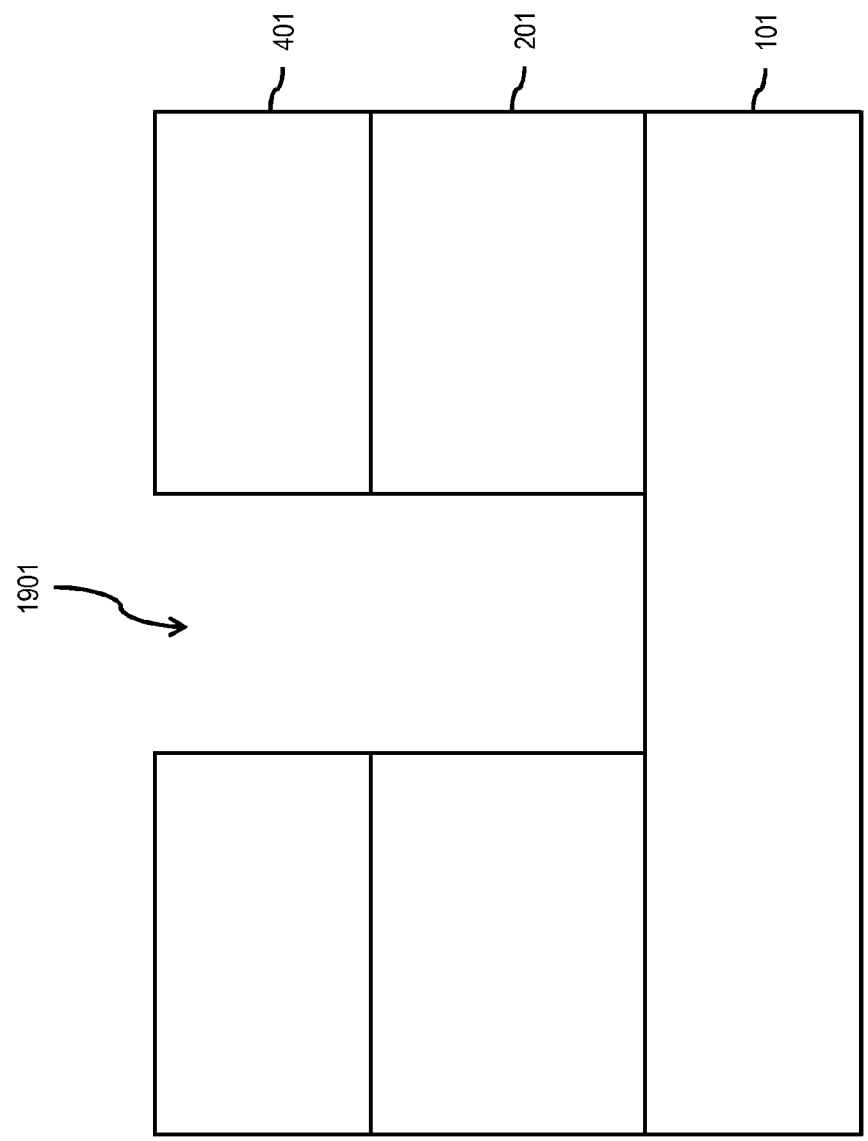

Next, a cell area 1901 may be formed by removing portions of the sacrificial layer 401 and the ILD 201, as illustrated in FIG. 19. The cell area 1901 may be formed according to any process, such as by a contact-etch process, as discussed above with respect to the cell area 501. The cell area 1901 may be formed to a width of 30 to 60 nm and down to the bottom electrode 101.

Figure 20:
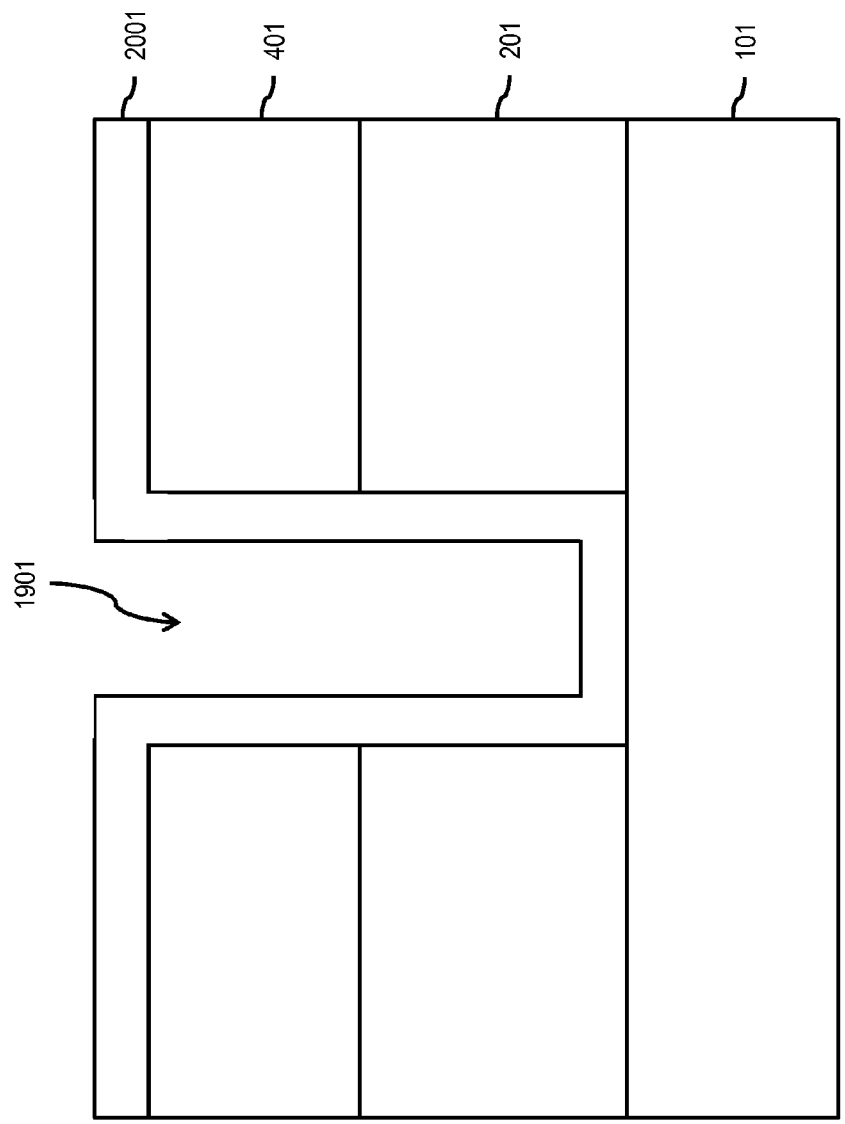

Adverting to FIG. 20, a metal layer 2001 may be conformally deposited over the sacrificial layer 401 and within the cell area 1901. The metal layer 2001 may be formed of W, Ti, TiN, or Al to a thickness of 10 to 100 Å.

Figure 21:
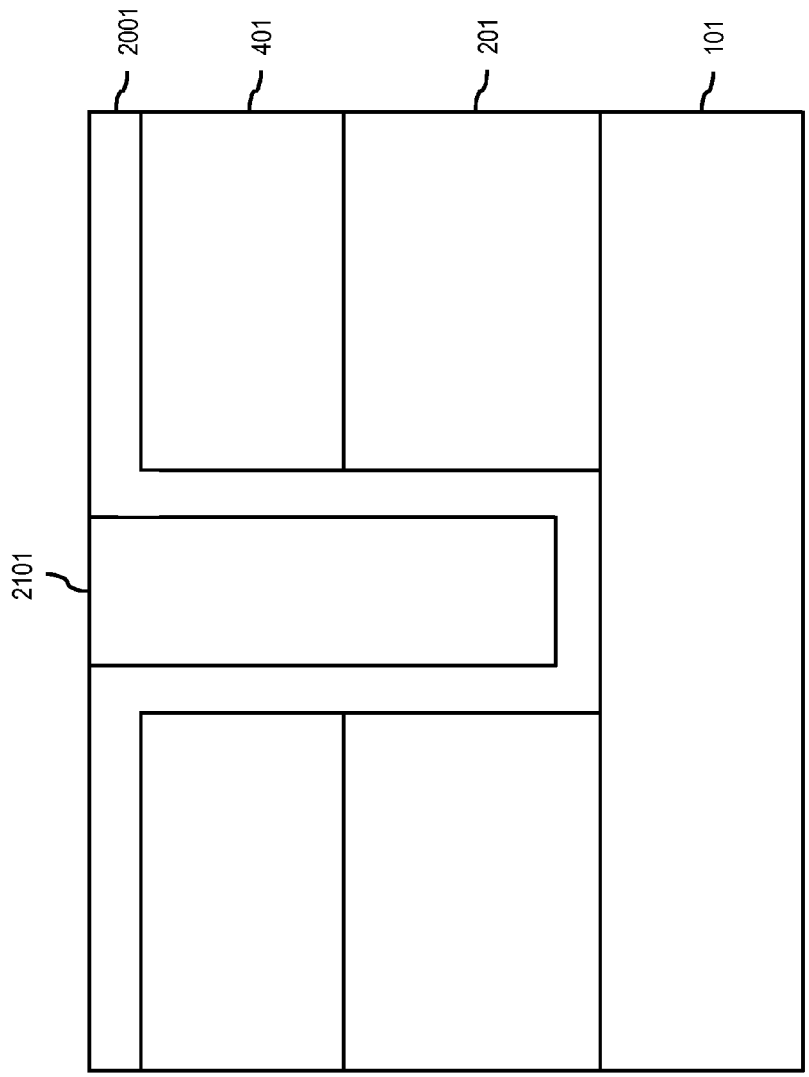

The remaining cell area 1901 may be subsequently filled with an interlayer dielectric material to form an interlayer dielectric structure 2101 (FIG. 21). The interlayer dielectric material used to form the interlayer dielectric structure 2101 may be any interlayer dielectric material, such as $SiO_2$, SiON, $Si_3N_4$, or fluorine-doped $SiO_2$, provided that the interlayer dielectric material employed differs from the material of the sacrificial layer 401. However, the interlayer dielectric material of the interlayer dielectric structure 2101 may be the same as (or different than) the interlayer dielectric material of the ILD 201. The interlayer dielectric structure 2101 may be formed to a width of the cell area 1901 less the thickness of the metal layer 2001 (e.g., 20 to 59 nm).

Figure 22:
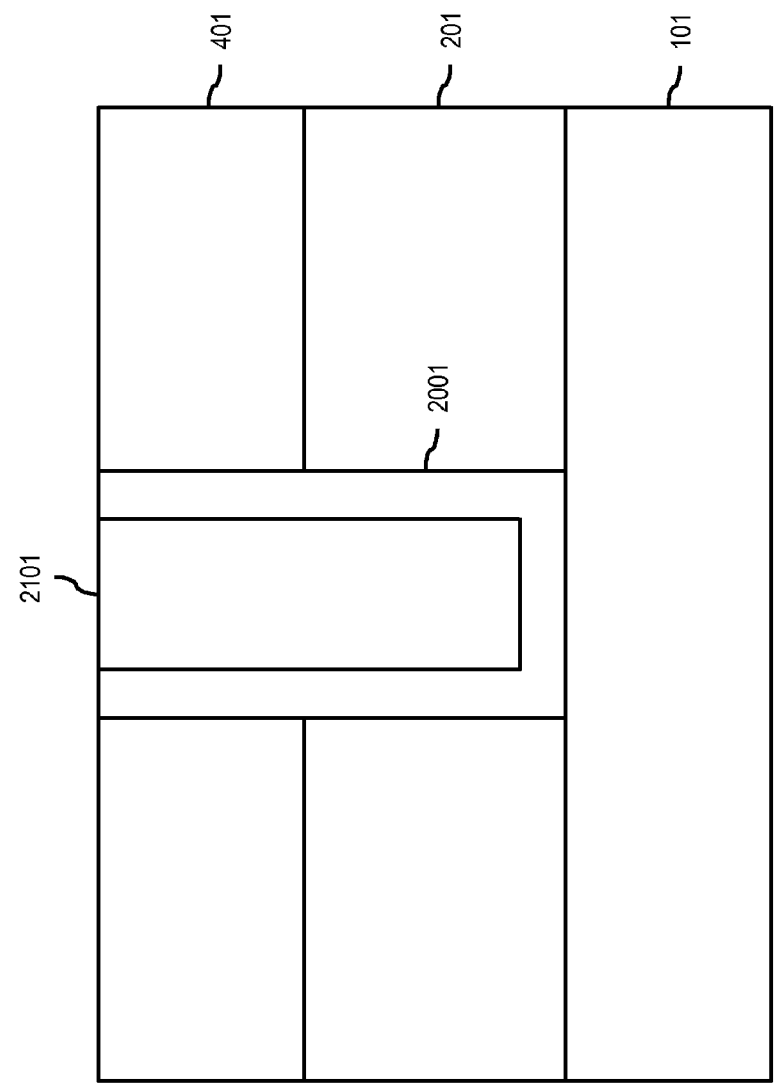

Subsequently, the metal layer 2001 and the interlayer dielectric structure 2101 above the top surface of the sacrificial layer 401 may be removed, as illustrated in FIG. 22. The metal layer 2001 and the interlayer dielectric structure 2101 above the top surface of the sacrificial layer 401 may be removed according to any known process, such as CMP down to the sacrificial layer 401.

Figure 23:
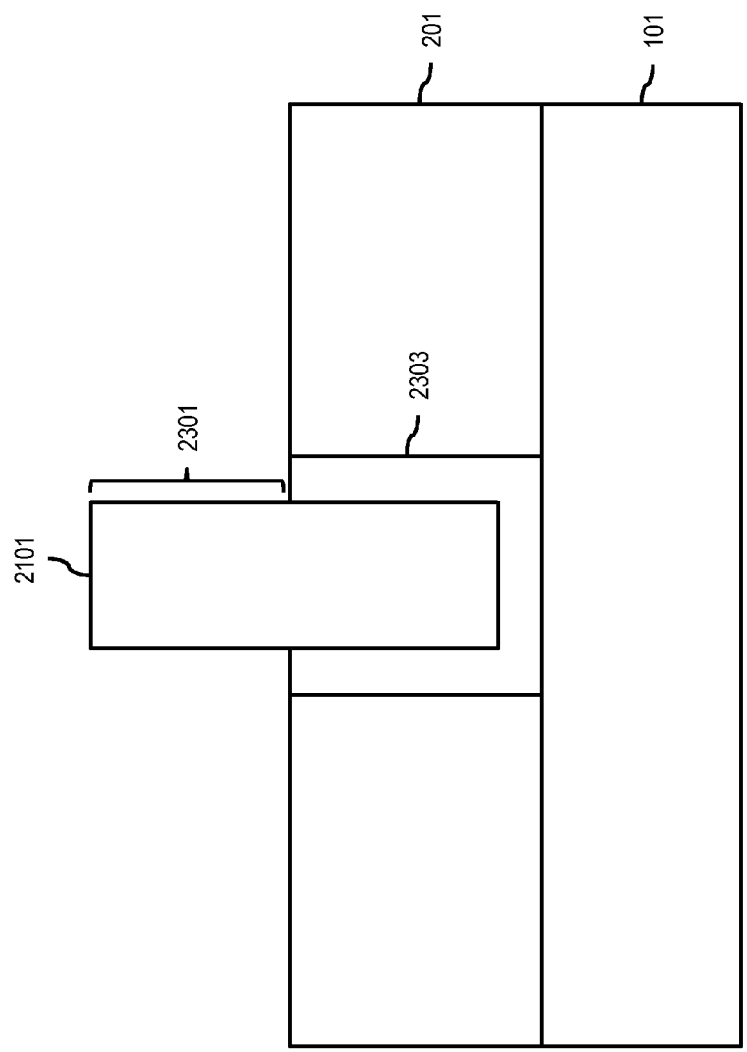

After the sacrificial layer 401 is exposed, it may be removed according to any process that is selective to the interlayer dielectric material of the interlayer dielectric structure 2101, such as a blanket etch process. Additionally, a portion of the metal layer 2001 that is above the top surface of the ILD 201 may be removed, exposing a protruding portion 2301 of the interlayer dielectric structure 2101, as illustrated in FIG. 23. The portion of the metal layer 2001 may be removed by the same etch process used to remove the sacrificial layer 401 or by another etch process. The remaining portion of the metal layer 2001 is a u-shaped metal layer 2303. As illustrated in FIG. 23, the top surface of the vertical portions of the u-shaped metal layer 2303 may be coplanar with the top surface of the ILD 201.

Figure 24:
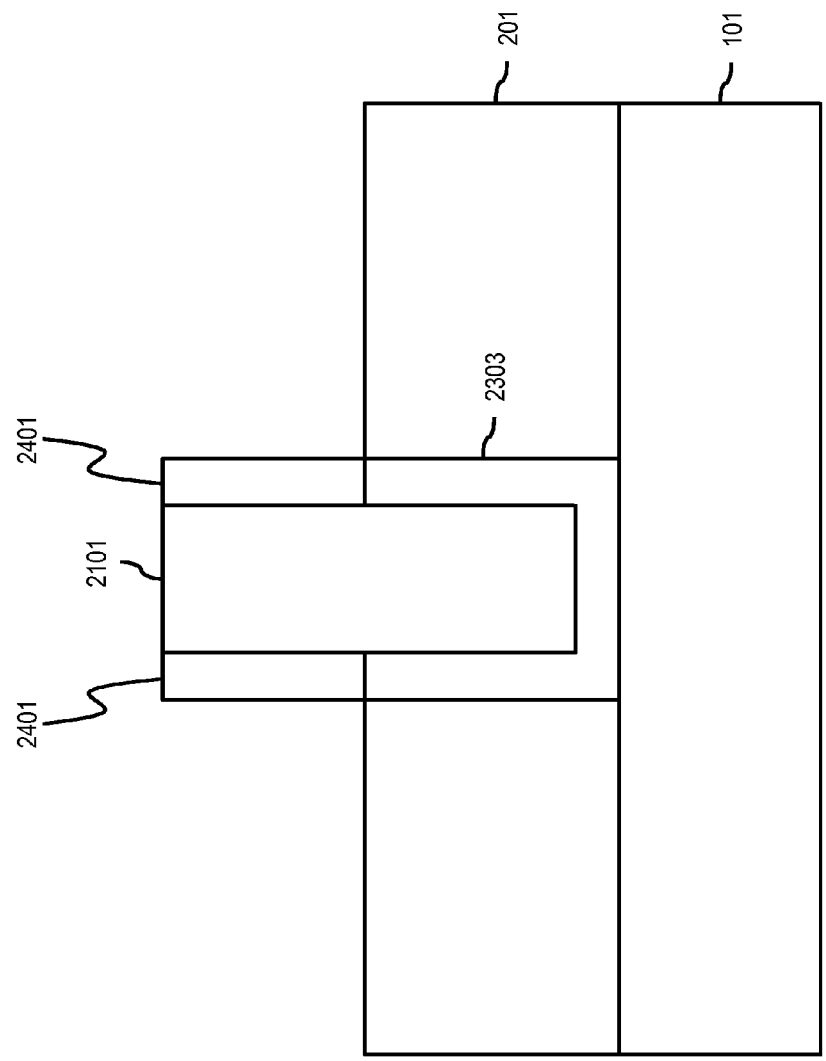

Adverting to FIG. 24, a memory layer 2401 may be formed surrounding the protruding portion 2301 of the interlayer dielectric structure 2101. The memory layer 2401 may be formed by any process, such as by conformally depositing the memory layer 2401 over the ILD 201 and the interlayer dielectric structure 2101 and subsequently removing the horizontal portions of the memory layer 2401 above both the ILD 201 and the interlayer dielectric structure 2101. The memory layer 2401 is thereby formed in the shape of thin spacers. A top surface of the memory layer 2401 may be coplanar with a top surface of the interlayer dielectric structure 2101. The memory layer 2401 may be formed of any type of RRAM-functional material, such as TiOx, NiOx, HfOx, WOx, TaOx, VOx, CuOx, or the like to a thickness of 10 to 100 Å.

Figure 25:
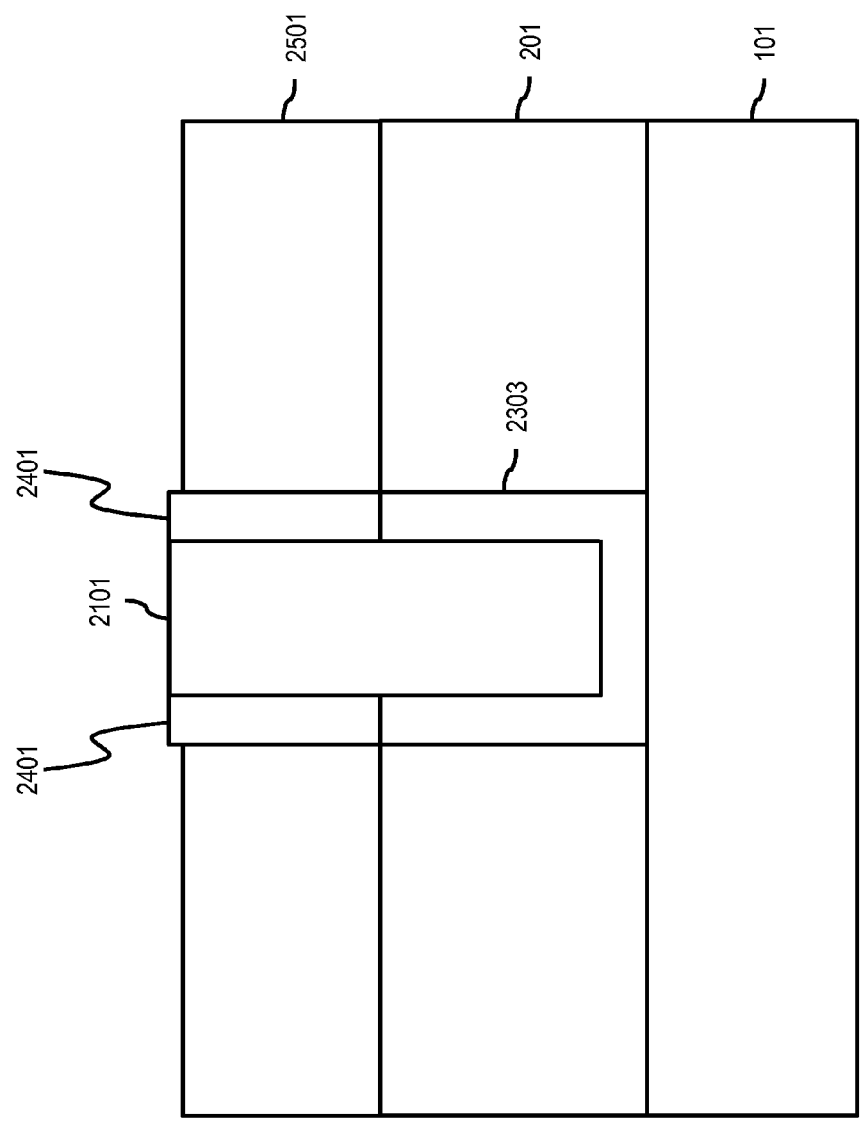

Subsequently, a dielectric layer 2501 may be formed surrounding the memory layer 2401 around the protruding portion 2301 of the interlayer dielectric structure 2101, as illustrated in FIG. 25. The dielectric layer 2501 may be formed of a dielectric material, such as $SiO_2$, SiON, or $Si_3N_4$ to a height less than the memory layer 2401 and the interlayer dielectric structure 2101. Alternatively, the dielectric layer 2501 may be formed coplanar with the memory layer 2401 and the interlayer dielectric structure 2101 (not shown for illustrative convenience).

Figure 26:
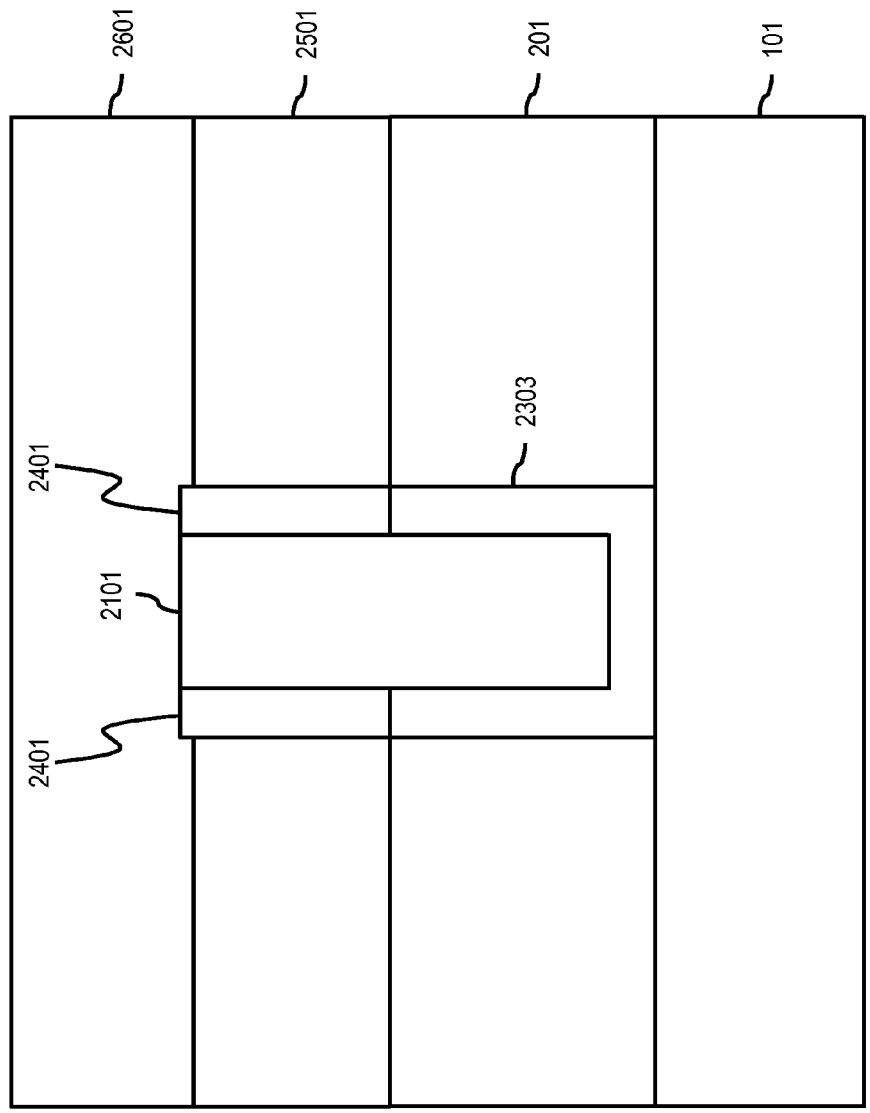

Subsequently, a top electrode 2601 may be formed over the entire structure, including the dielectric layer 2501, memory layer 2401, and the interlayer dielectric structure 2101, as illustrated in FIG. 26. The top electrode 2601 may be formed of Al, Pt, TiN/Ti, TiN, Ru, Ni, or polysilicon to a thickness of 100 to 1000 Å. The resulting structure is an RRAM structure with an improved memory margin.

Figure 27:
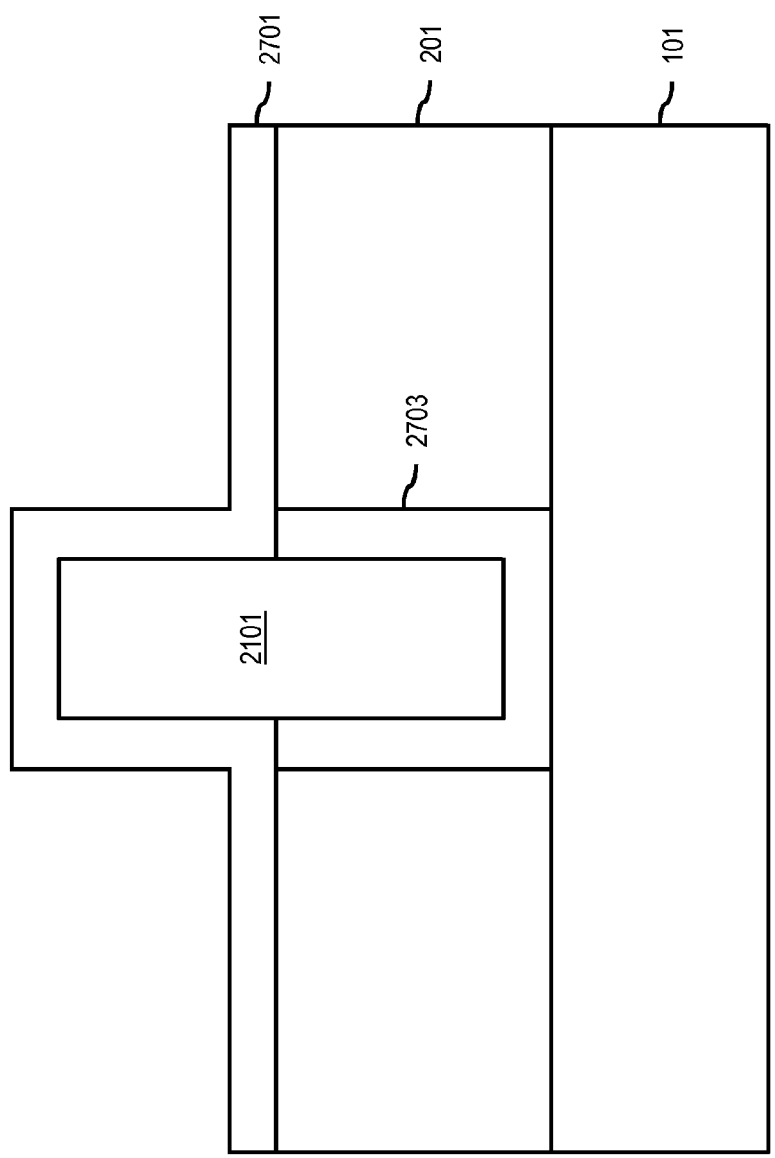

Alternatively, FIG. 27 illustrates a method of forming an RRAM structure with an improved memory margin, in accordance with yet another exemplary embodiment. After removing the sacrificial layer 401 exposing the protruding portion 2301 of the interlayer dielectric structure 2101, as discussed above with respect to FIG. 23, a memory layer 2701 may be formed by conformally depositing the memory layer 2701 over the ILD 201 and the interlayer dielectric structure 2101. The memory layer 2701 may be formed of any type of RRAM-functional material, such as TiOx, NiOx, HfOx, WOx, TaOx, VOx, CuOx, or the like to a thickness of 10 to 100 Å.

Figure 28:
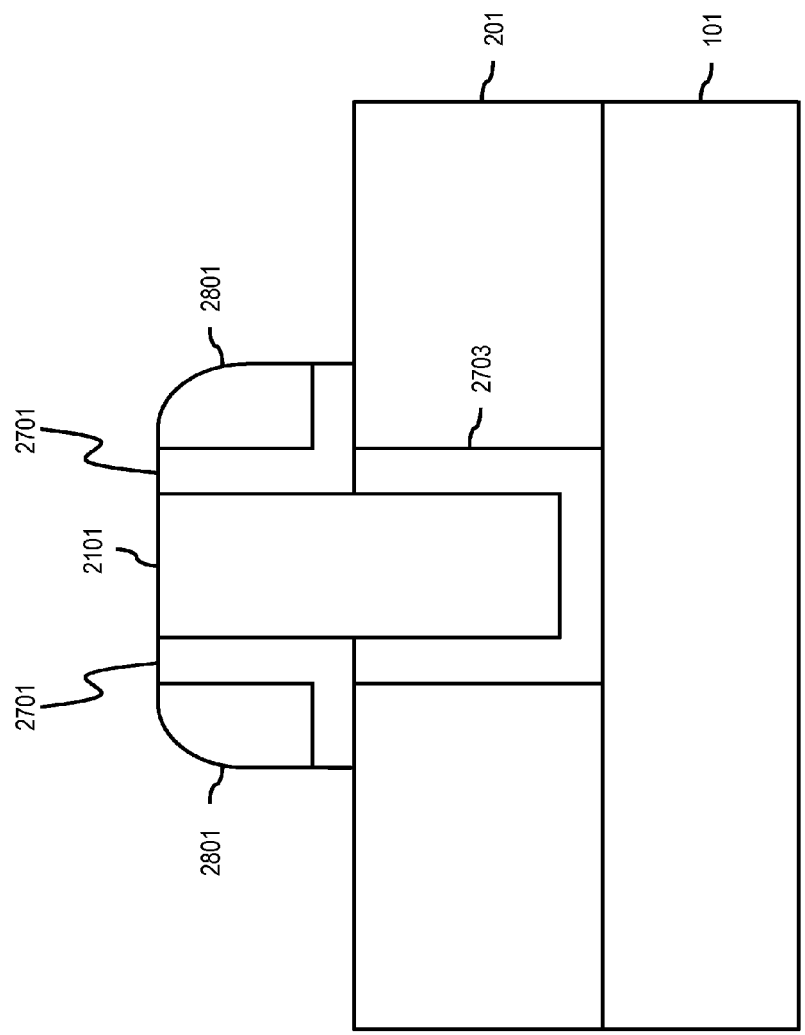

Subsequently, a dielectric layer 2801 may be formed as spacers surrounding the memory layer 2701 around the protruding portion 2301 of the interlayer dielectric structure 2101, as illustrated in FIG. 28. The dielectric layer 2801 may be formed of a dielectric material, such as $SiO_2$, SiON, or $Si_3N_4$, to a horizontal width of 5 to 30 nm. Upon forming the dielectric layer 2801, the portions of the memory layer 2701 that are not covered by the dielectric layer 2801 may be removed, such as above the protruding portion 2301 of the interlayer dielectric structure 2101 and on either edge of the dielectric layer 2801 above the ILD 201. The memory layer 2701 is thereby formed with an L-shaped cross-section. As discussed above, the dielectric layer 2801 may be formed to a shorter height than the memory layer 2701 and the interlayer dielectric structure 2101 to expose the memory layer 2701 (not shown for illustrative convenience). Alternatively, the top surfaces of the dielectric layer 2801, the memory layer 2701, and the interlayer dielectric structure 2101 may be coplanar.

Figure 29:
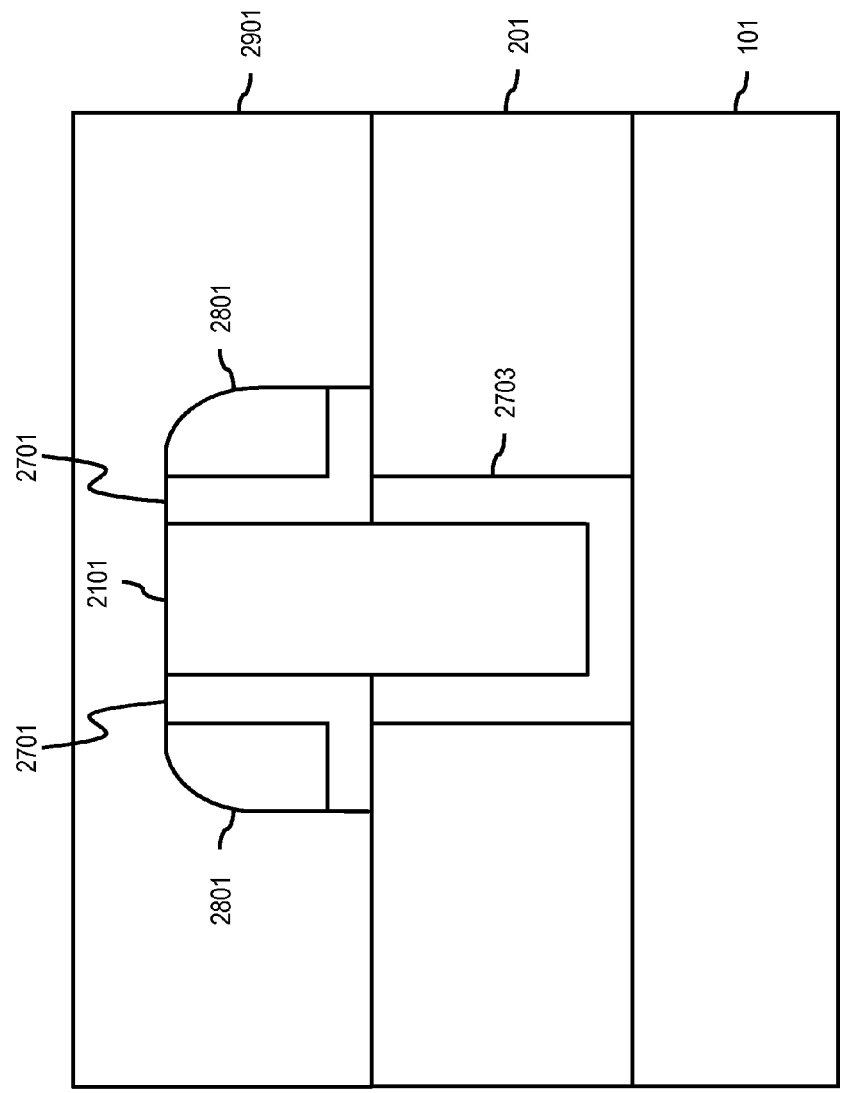

Next, a top electrode 2901 may be formed over the entire structure, including the ILD 201, the dielectric layer 2801, and the interlayer dielectric structure 2101, as illustrated in FIG. 29. The top electrode 2901 may be formed of Al, Pt, TiN, TiN/Ti, Ru, Ni, or polysilicon to a thickness of 100 to 1000 Å.

Figure 30:
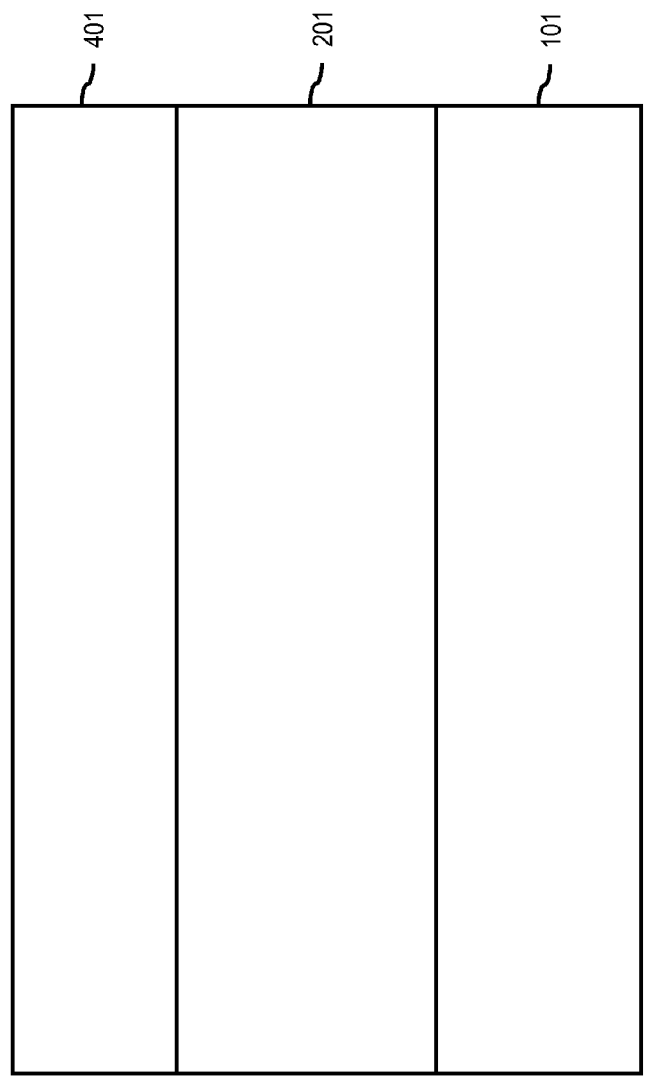

Adverting to FIG. 30, a method of forming an RRAM structure with an improved memory margin, in accordance with a further exemplary embodiment, begins with the bottom electrode 101, the ILD 201, and the sacrificial layer 401, as illustrated in FIG. 18.

Figure 31:
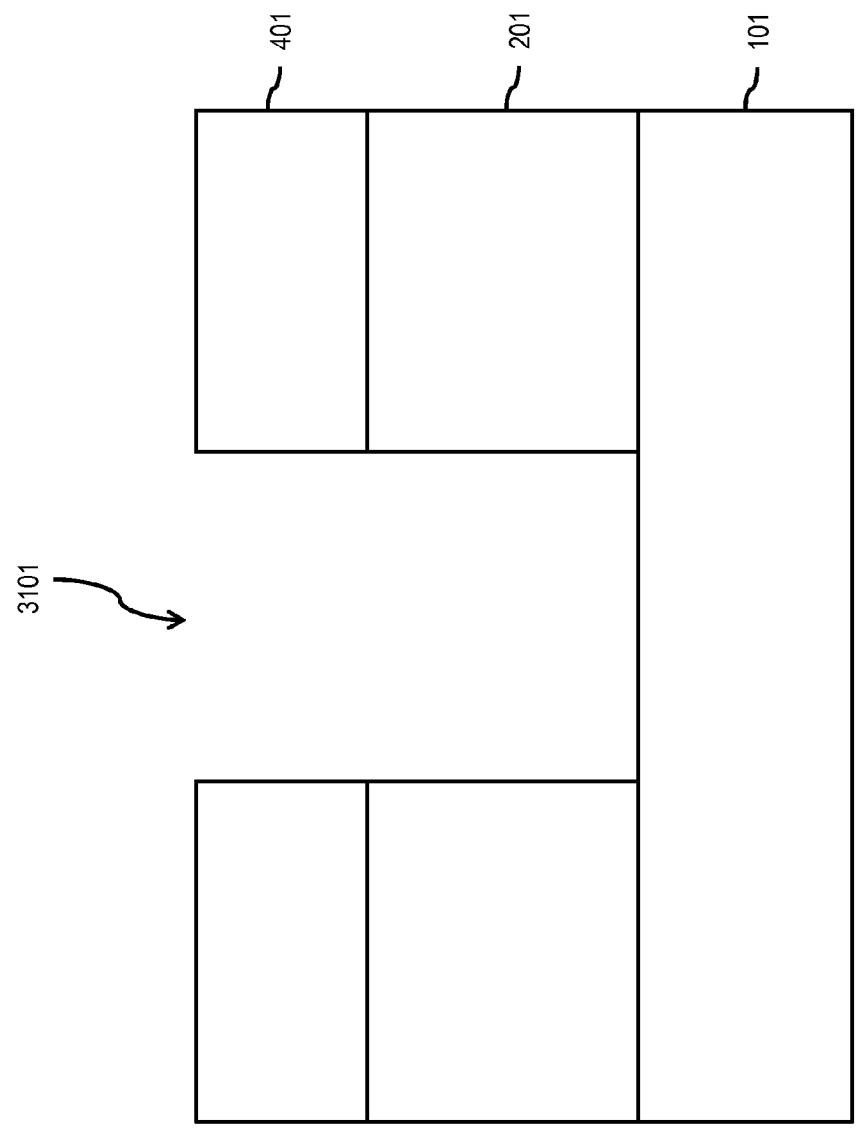

Next, a cell area 3101 may be formed by removing portions of the sacrificial layer 401 and the ILD 201, as illustrated in FIG. 31. The cell area 3101 may be formed according to any process, such as by a contact-etch process, as discussed above with respect to the cell area 501, and may be formed to a width of 30 to 60 nm and down to the bottom electrode 101.

Figure 32:
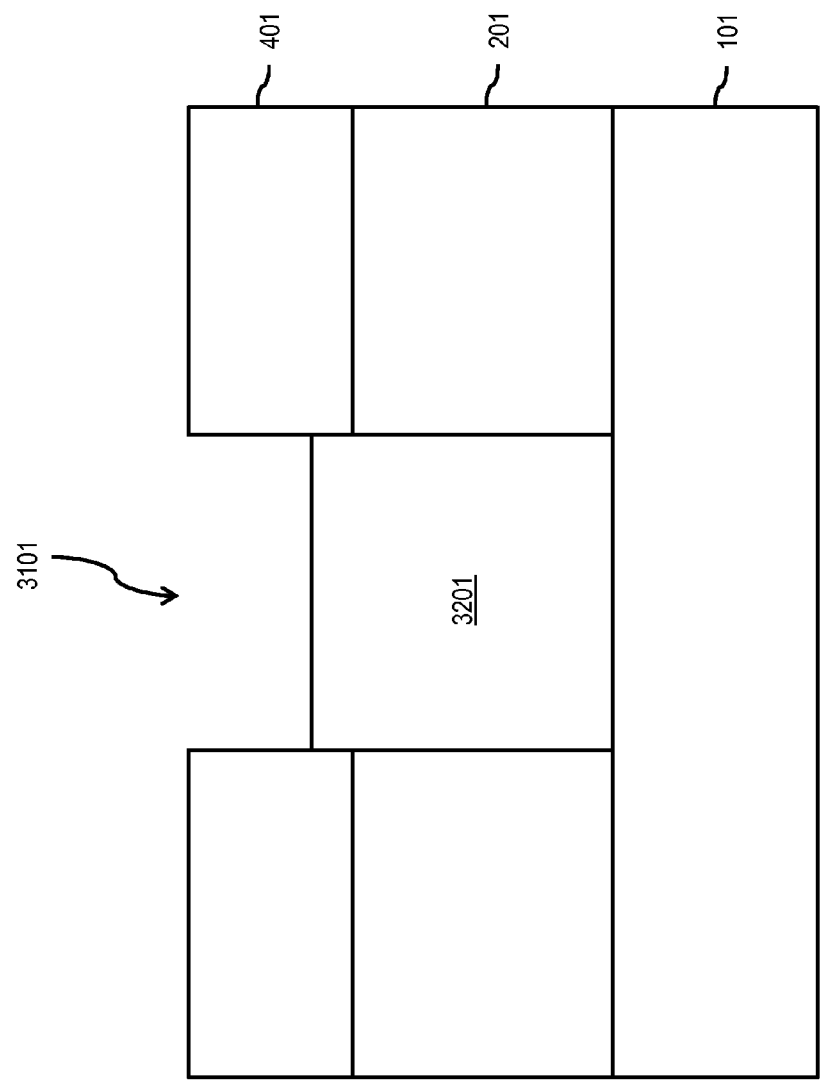

Adverting to FIG. 32, a metal layer 3201 may formed within the cell area 3101. The metal layer 3201 may be formed of W, Ti, Al or TiN to a width of 30 to 60 nm (e.g., the width of the cell area 3101) and a height of 50 to 500 nm. Thus, as illustrated, the metal layer 3201 may be formed in the shape of a rectangle.

Figure 33:
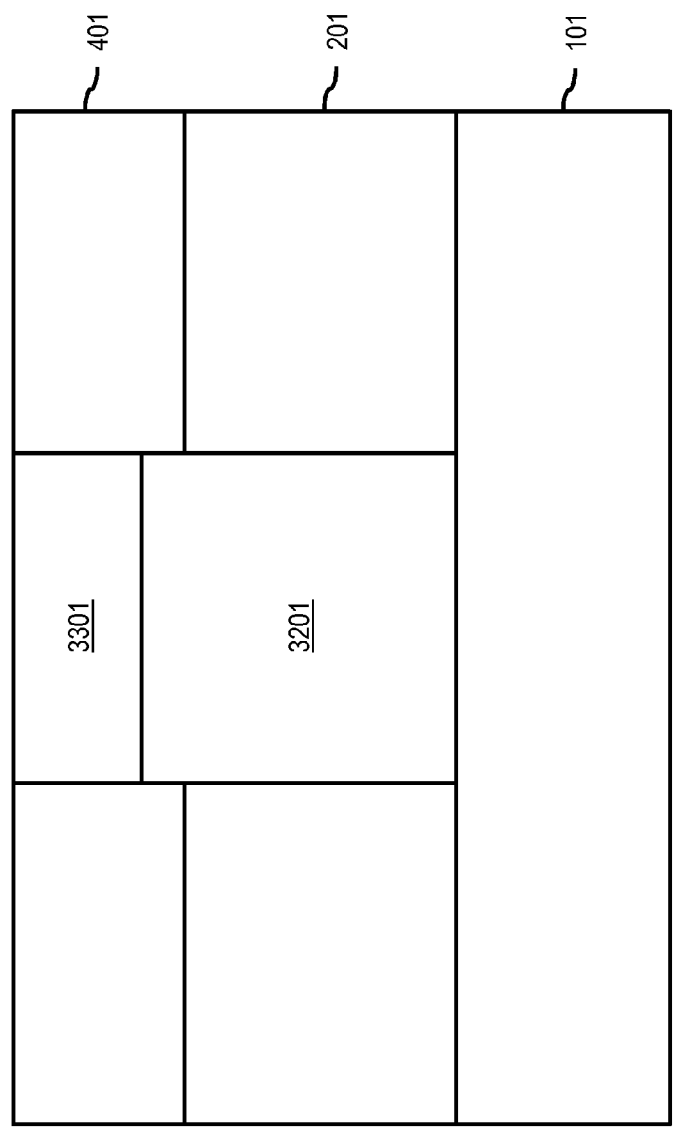

The remaining cell area 3101 may be subsequently filled with an interlayer dielectric material to form an interlayer dielectric structure 3301 (FIG. 33). The interlayer dielectric material used to form the interlayer dielectric structure 3301 may be any interlayer dielectric material, such as $SiO_2$, SiON, $Si_3N_4$, or fluorine-doped $SiO_2$, provided that the interlayer dielectric material employed differs from the sacrificial layer 401. However, the interlayer dielectric material of the interlayer dielectric structure 3301 may be the same as (or different than) the interlayer dielectric material of the ILD 201.

Figure 34:
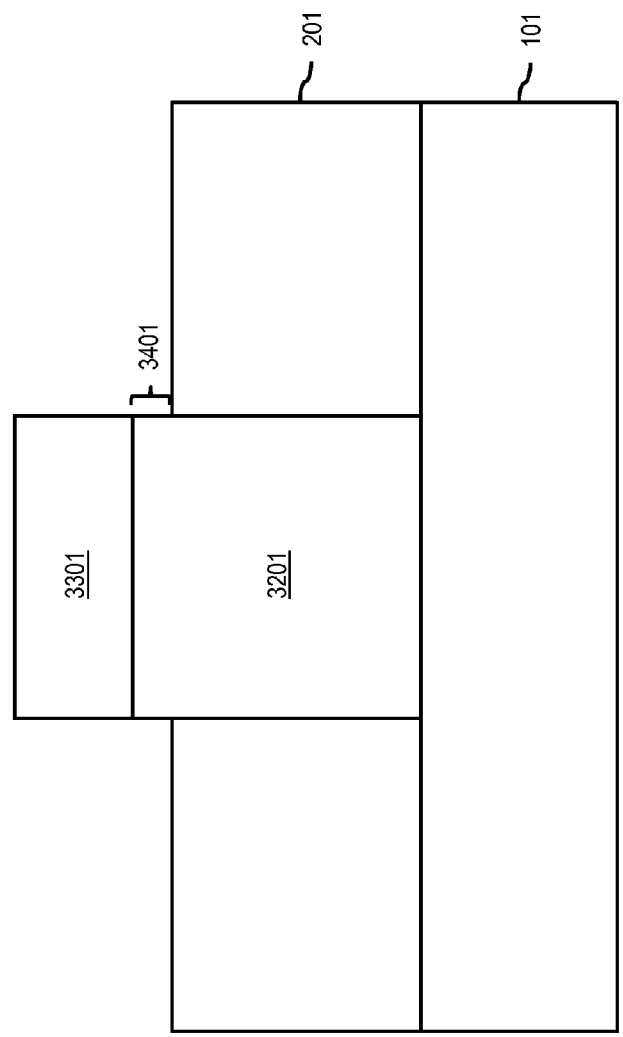

Subsequently, the sacrificial layer 401 may be removed, as illustrated in FIG. 34, according to any process that is selective to the interlayer dielectric structure 3301, such as a blanket etch process. Removal of the sacrificial layer 401 exposes the interlayer dielectric structure 3301 and a portion 3401 of the metal layer 3201.

Figure 35:
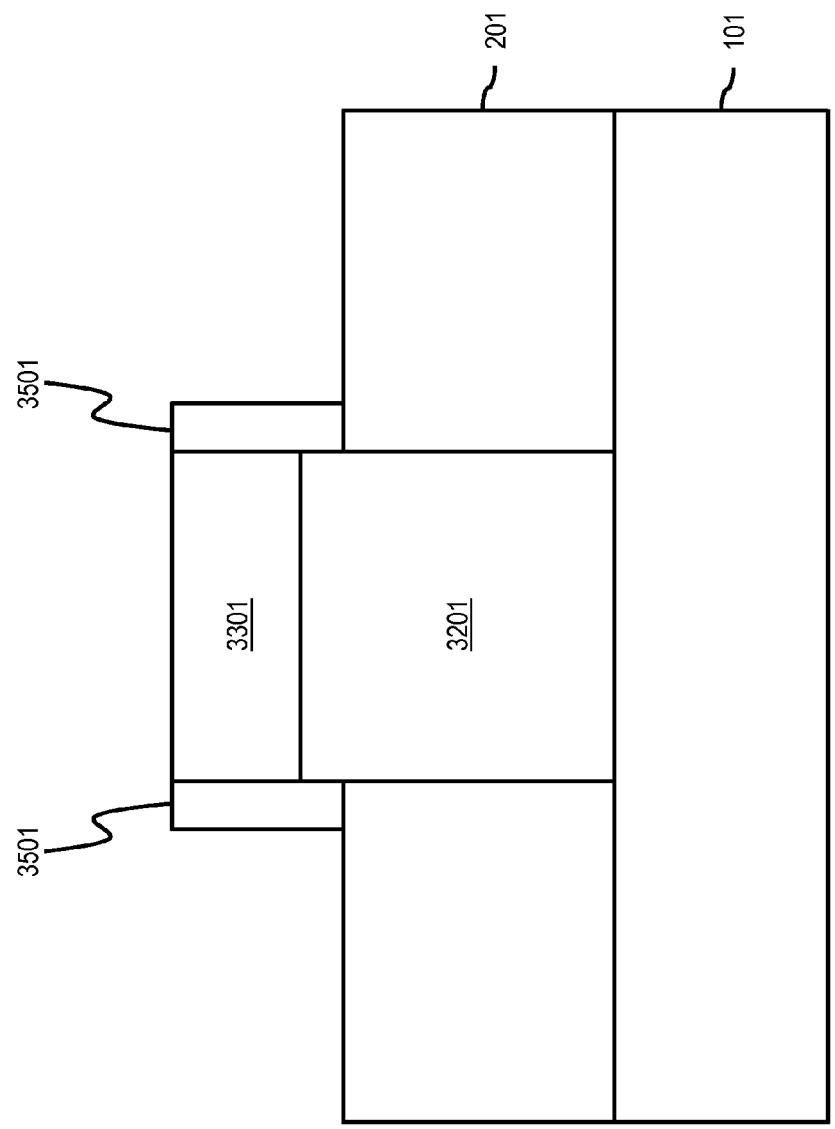

Adverting to FIG. 35, a memory layer 3501 may be formed surrounding the interlayer dielectric structure 3301 and the portion 3401 of the metal layer 3201. The memory layer 3501 may be formed by any process, such as by conformally depositing the memory layer 3501 over the ILD 201 and the interlayer dielectric structure 3301 and subsequently removing the horizontal portions of the memory layer 3501 above both the ILD 201 and the interlayer dielectric structure 3301. The memory layer 3501 is thereby formed in the shape of thin spacers. A top surface of the memory layer 3501 may be coplanar with a top surface of the interlayer dielectric structure 3301. The memory layer 3501 may be formed of any type of RRAM-functional material, such as TiOx, NiOx, HfOx, WOx, TaOx, VOx, CuOx, or the like to a thickness of 10 to 100 Å.

Figure 36:
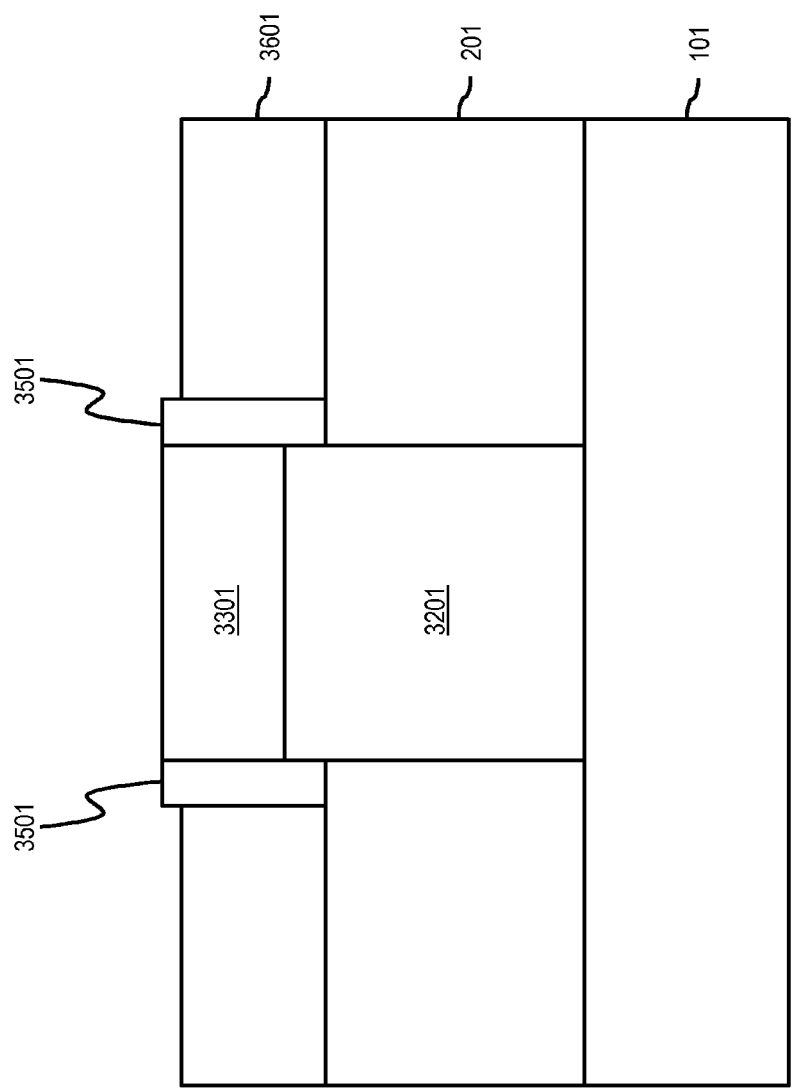

Subsequently, a dielectric layer 3601, such as $SiO_2$, SiON, or $Si_3N_4$, may be formed surrounding the memory layer 3501 around the interlayer dielectric structure 3301 and the portion 3401 of the metal layer 3201, as illustrated in FIG. 36. The dielectric layer 3601 may be formed to a shorter height than the memory layer 3501 and the interlayer dielectric structure 3301. Alternatively, the dielectric layer 3601 may be formed coplanar with the memory layer 3501 and the interlayer dielectric structure 3301 (not shown for illustrative convenience).

Figure 37:
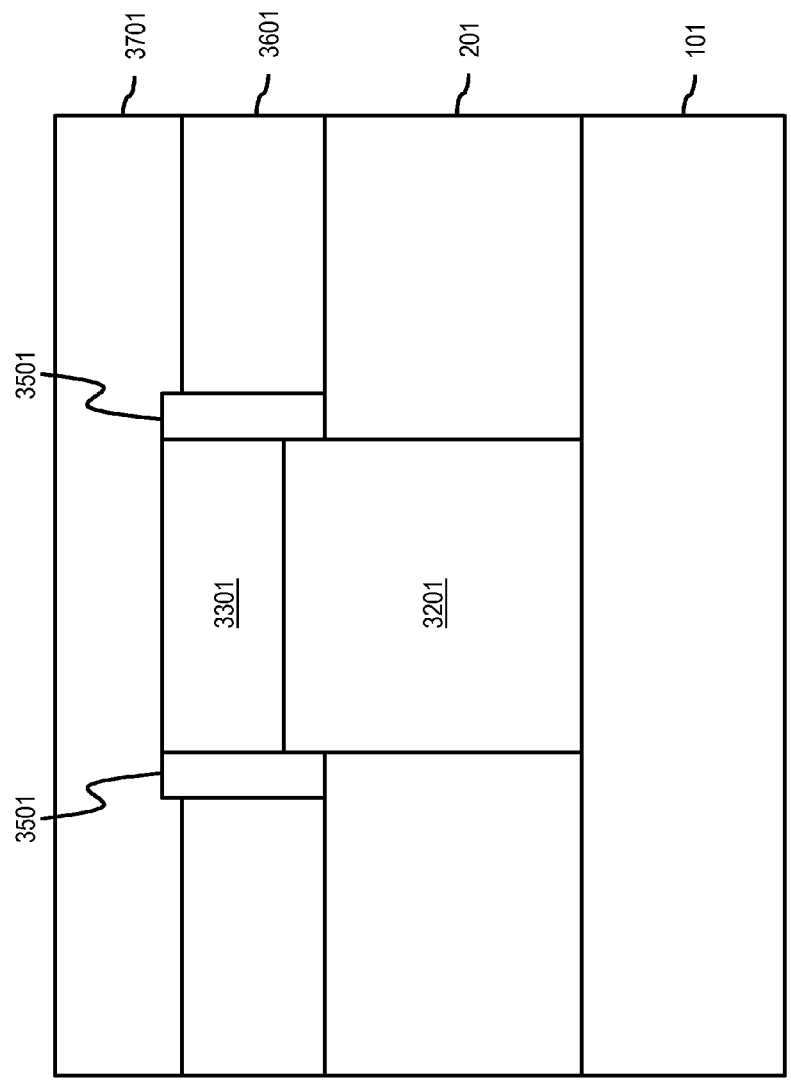

Subsequently, a top electrode 3701 may be formed over the entire structure, including the dielectric layer 3601, the memory layer 3501 and the interlayer dielectric structure 3301, as illustrated in FIG. 37. The top electrode 3701 may be formed of Al, Pt, TiN/Ti, TiN, Ru, Ni, or polysilicon to a thickness of 100 to 1000 Å. The resulting structure is an RRAM structure with an improved memory margin.

Figure 38:
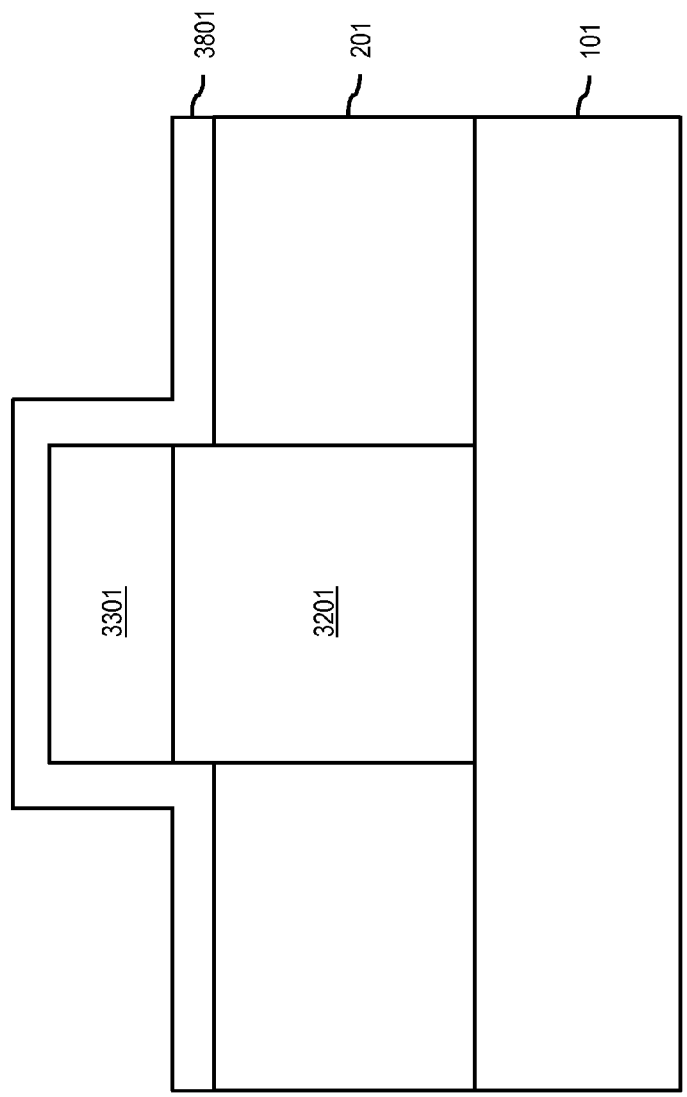

Alternatively, FIG. 38 illustrates a method of forming an RRAM structure with an improved memory margin, in accordance with yet an additional exemplary embodiment. After removing the sacrificial layer 401 exposing the interlayer dielectric structure 3301 and the portion 3401 of the metal layer 3201, as discussed above with respect to FIG. 34, a memory layer 3801 may be formed by conformally depositing the memory layer 3801 over the ILD 201 and the interlayer dielectric structure 3301. The memory layer 3801 may be formed of any type of RRAM-functional material, such as TiOx, NiOx, HfOx, WOx, TaOx, VOx, CuOx, or the like to a thickness of 10 to 100 Å.

Figure 39:
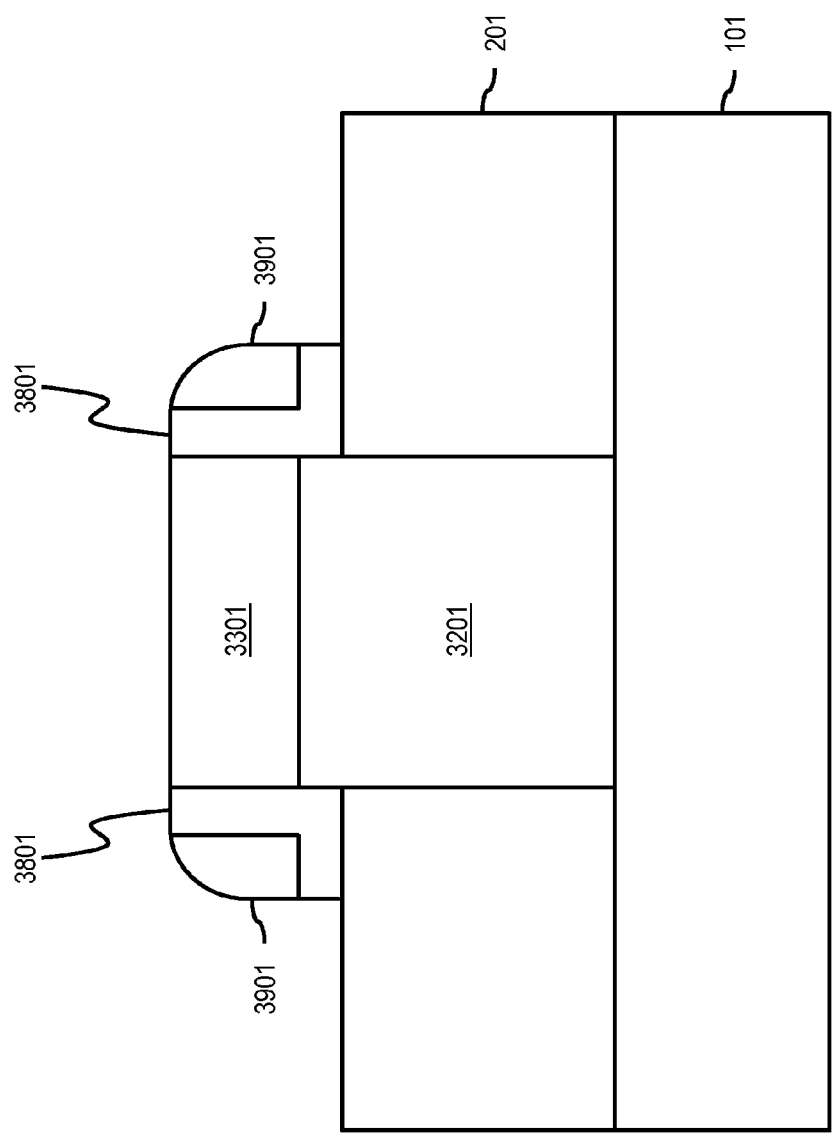

Subsequently, a dielectric layer 3901, such as $SiO_2$, SiON, or $Si_3N_4$, may be formed as spacers surrounding the memory layer 3801 around the interlayer dielectric structure 3301 and the portion 3401 of the metal layer 3201 to a horizontal width of 5 to 30 nm, as illustrated in FIG. 39. Upon forming the dielectric layer 3901, the portions of the memory layer 3801 that are not covered by the dielectric layer 3901 may be removed, such as above the interlayer dielectric structure 3301 and on either edge of the dielectric layer 3901 above the ILD 201. As discussed above, the dielectric layer 3901 may be formed to a lesser height than the memory layer 3801 and the interlayer dielectric structure 3301, to expose the memory layer 3801 (not shown for illustrative convenience). Alternatively, the top surfaces of the dielectric layer 3901, the memory layer 3801, and the interlayer dielectric structure 3301 may be coplanar.

Figure 40:
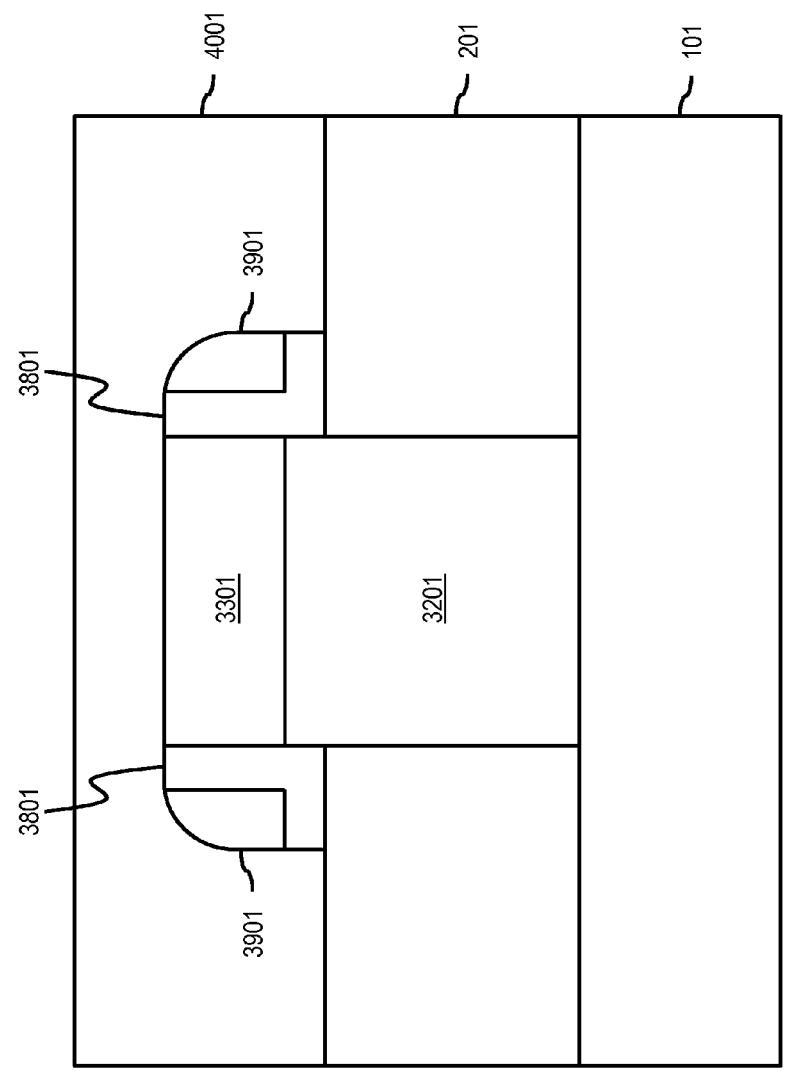

Next, a top electrode 4001 may be formed over the entire structure, including the ILD 201, the dielectric layer 3901, and the interlayer dielectric structure 3301, as illustrated in FIG. 40. The top electrode 4001 may be formed of Al, Pt, TiN/Ti, TiN, Ru, Ni, or polysilicon to a thickness of 100 to 1000 Å.

The embodiments of the present disclosure achieve several technical effects, including RRAM structures with improved memory margins. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming an interlayer dielectric (ILD) over a bottom electrode;
    forming a sacrificial layer over the ILD;
    removing a portion of the ILD and a portion of the sacrificial layer vertically contiguous with the portion of the ILD, forming a cell area;
    forming a metal layer within the cell area;
    forming an interlayer dielectric structure above or surrounded by and protruding above the metal layer, a top surface of the interlayer dielectric structure being coplanar with a top surface of the sacrificial layer;
    removing the sacrificial layer;
    forming a memory layer on the ILD and/or on side surfaces of the interlayer dielectric structure; and
    forming a dielectric layer surrounding at least a portion of the interlayer dielectric structure.

2. A method according to claim 1, comprising:
    forming the memory layer prior to forming the sacrificial layer;
    forming the dielectric layer on the memory layer after removing the sacrificial layer; and
    removing a portion of the memory layer from the ILD not under the dielectric layer.

3. A method according to claim 1, comprising:
    forming the memory layer on side surfaces of the portion of the interlayer dielectric structure above the metal layer; and
    forming the dielectric layer surrounding the memory layer.

4. A method according to claim 1, comprising:
    forming the memory layer on side surfaces of the portion of the interlayer dielectric structure and on the ILD; and
    forming the dielectric layer above the memory layer on the ILD and surrounding the memory layer on the side surfaces of the portion of the interlayer dielectric structure.

5. A method according to claim 1, comprising forming the metal layer as rectangular-shaped within the cell area below the interlayer dielectric structure.

6. A method according to claim 5, comprising forming a top surface of the metal layer above a top surface of the ILD.

7. A method according to claim 1, comprising forming the metal layer as u-shaped within the cell area and between the memory layer and interlayer dielectric structure with a top surface of the u-shaped metal layer being coplanar with a top surface of the memory layer.

8. A method according to claim 7, comprising:
    forming the memory layer on the ILD; and
    forming a top surface of the metal layer coplanar with a top surface of the memory layer.

9. A method according to claim 1, further comprising forming a top electrode over the ILD, the dielectric layer, and the interlayer dielectric structure.

10. A method comprising:
    forming an interlayer dielectric (ILD) over a bottom electrode;
    forming a sacrificial layer on the ILD;
    removing a portion of the ILD and the sacrificial layer, forming a cavity;
    forming a metal layer within the cavity;
    filling the cavity with an interlayer dielectric material;
    removing the sacrificial layer exposing at least a portion of the interlayer dielectric material;
    forming a memory layer on side surfaces of the interlayer dielectric material and/or on the ILD surrounding the interlayer dielectric material;
    forming a dielectric layer surrounding the interlayer dielectric material and/or the memory layer; and
    forming a top electrode over the ILD, the dielectric layer, and the interlayer dielectric material.

* * * * *